US011121892B2

(12) United States Patent
Pinto et al.

(10) Patent No.: US 11,121,892 B2
(45) Date of Patent: Sep. 14, 2021

(54) DIGITAL MODULATION SCHEME FOR DATA TRANSFER

(71) Applicant: Analog Devices Global Unlimited Company, Limerick (IE)

(72) Inventors: Ryan Pinto, Winchester, MA (US); Jonathan Ephraim David Hurwitz, Edinburgh (GB); Lawrence Getzin, Rye, NH (US)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/612,087

(22) PCT Filed: May 11, 2018

(86) PCT No.: PCT/IB2018/053309
§ 371 (c)(1),
(2) Date: Nov. 8, 2019

(87) PCT Pub. No.: WO2018/207150
PCT Pub. Date: Nov. 15, 2018

(65) Prior Publication Data
US 2020/0344093 A1    Oct. 29, 2020

Related U.S. Application Data

(60) Provisional application No. 62/504,893, filed on May 11, 2017.

(51) Int. Cl.
*H04L 25/02* (2006.01)
*H03M 1/12* (2006.01)
*H03M 3/00* (2006.01)

(52) U.S. Cl.
CPC ........ *H04L 25/0268* (2013.01); *H03M 1/123* (2013.01); *H03M 3/41* (2013.01)

(58) Field of Classification Search
CPC ...... H04L 25/0268; H03M 3/41; H03M 1/123
(Continued)

(56) References Cited

U.S. PATENT DOCUMENTS 4,810,204 A    3/1989 Wilson
4,843,299 A    6/1989 Hutchings
(Continued)

FOREIGN PATENT DOCUMENTS

EP    2248040 B1    5/2013
GB    2395373 A     5/2004
(Continued)

OTHER PUBLICATIONS

"International Application Serial No. PCT/IB2018/053309, International Search Report dated Aug. 21, 2018", 4 pgs.
(Continued)

*Primary Examiner* — Khai M Nguyen
(74) *Attorney, Agent, or Firm* — Schwegman Lundberg & Woessner, P.A.

(57) ABSTRACT

Various examples are directed to isolated analog-to-digital converter (ADC) circuits comprising a first side that is separated from a second side by an isolator. A first ADC positioned on the first side may be configured to convert a first analog input signal to a first side multi-bit digital signal. A digital modulator on the first side may be configured to convert the first side multi-bit digital signal to a first single-bit stream. A first filter positioned on the second side may be configured to receive the first single-bit stream across the first isolator and to generate a first reconstructed multi-bit digital signal using the first single-bit stream.

20 Claims, 24 Drawing Sheets

(58) Field of Classification Search
USPC .......................................................... 341/141
See application file for complete search history.

(56) References Cited

U.S. PATENT DOCUMENTS

| | | | |
|---|---|---|---|
| 4,849,682 A | 7/1989 | Bauerr et al. | |
| 4,965,738 A | 10/1990 | Bauer et al. | |
| 5,057,383 A | 10/1991 | Sokira | |
| 6,184,654 B1 | 2/2001 | Bachner, III et al. | |
| 6,394,402 B2 | 5/2002 | Coonan et al. | |
| 7,109,684 B2 | 9/2006 | Takaoka | |
| 7,259,539 B2 | 8/2007 | Suzuki et al. | |
| 7,352,570 B2 | 4/2008 | Smith et al. | |
| 7,525,280 B2 | 4/2009 | Fagan et al. | |
| 7,528,574 B1 | 5/2009 | Adkins et al. | |
| 7,736,773 B2 | 6/2010 | DeSsorbo | |
| 7,782,607 B2 | 8/2010 | Harbin et al. | |
| 7,800,255 B2 | 9/2010 | Coonan | |
| 7,830,668 B2 | 11/2010 | Coonan et al. | |
| 7,849,250 B2 | 12/2010 | Diener et al. | |
| 7,855,530 B2 | 12/2010 | Coonan et al. | |
| 8,144,446 B2* | 3/2012 | Boutorabi | G01R 19/2513 361/115 |
| 8,160,727 B2 | 4/2012 | Coonan et al. | |
| 8,169,191 B2 | 5/2012 | Werthman et al. | |
| 8,180,485 B2 | 5/2012 | Reckelhoff | |
| 8,227,943 B2 | 7/2012 | Harbin et al. | |
| 8,271,216 B2* | 9/2012 | White | G01R 15/146 702/61 |
| 8,338,985 B2 | 12/2012 | Murtha et al. | |
| 8,508,188 B2 | 8/2013 | Murtha | |
| 8,598,740 B2 | 12/2013 | Murtha et al. | |
| 8,775,828 B2 | 7/2014 | Coonan et al. | |
| 8,818,265 B2* | 8/2014 | Steeneken | H03K 17/00 455/39 |
| 8,873,644 B1* | 10/2014 | Todsen | H03M 3/368 375/247 |
| 9,155,682 B2 | 10/2015 | Boyd | |
| 9,261,538 B2* | 2/2016 | Cojocaru | G01R 31/42 |
| 9,381,822 B2 | 7/2016 | Scheucher | |
| 9,509,154 B2 | 11/2016 | Alobaidi et al. | |
| 9,544,027 B2* | 1/2017 | Cornell | H04B 5/0093 |
| 9,563,247 B2 | 2/2017 | Chou et al. | |
| 9,587,878 B2 | 3/2017 | Paydar et al. | |
| 9,705,359 B2 | 7/2017 | Boyd | |
| 9,800,071 B2 | 10/2017 | Martaeng et al. | |
| 9,853,749 B2* | 12/2017 | Bessegato | H04B 17/0085 |
| 2005/0052085 A1 | 3/2005 | Chang et al. | |
| 2005/0271149 A1 | 12/2005 | Dupuis | |
| 2007/0228680 A1 | 10/2007 | Reppert et al. | |
| 2008/0191850 A1 | 8/2008 | Koertge et al. | |
| 2009/0119844 A1 | 5/2009 | Barnett et al. | |
| 2010/0001689 A1 | 1/2010 | Hultman et al. | |
| 2010/0004780 A1 | 1/2010 | Rickelhoff | |
| 2012/0203377 A1 | 8/2012 | Paydar et al. | |
| 2014/0342190 A1 | 11/2014 | Tamburrino | |
| 2014/0344610 A1 | 11/2014 | Ross | |
| 2015/0100154 A1 | 4/2015 | Rickelhoff | |
| 2016/0020623 A1 | 1/2016 | Tamburrino et al. | |
| 2016/0056829 A1 | 2/2016 | Glibbery et al. | |
| 2016/0126513 A1 | 5/2016 | Mifsud | |
| 2016/0260943 A1 | 9/2016 | Tamburrino | |
| 2017/0005512 A1 | 1/2017 | Boyd | |
| 2017/0133863 A1 | 5/2017 | Tamburrino et al. | |

FOREIGN PATENT DOCUMENTS

| | | |
|---|---|---|
| WO | WO-2009108301 A1 | 9/2009 |
| WO | WO-2011129802 A1 | 10/2011 |
| WO | WO-2018207150 A1 | 11/2018 |

OTHER PUBLICATIONS

"International Application Serial No. PCT/IB2018/053309, Written Opinion dated Aug. 21, 2018", 9 pgs.

* cited by examiner

US 11,121,892 B2

DIGITAL MODULATION SCHEME FOR DATA TRANSFER

PRIORITY

This application is a U.S. National Stage Filing under 35 U.S.C. § 371 of International Patent Application Serial No. PCT/IB2018/053309, filed May 11, 2018, and published on Nov. 15, 2018, as WO 2018/207150 A1, which claims the benefit of U.S. Provisional Patent Application Ser. No. 62/504,893 filed on May 11, 2017, which are incorporated herein by reference in their entirety.

FIELD OF THE DISCLOSURE

This document pertains generally, but not by way of limitation, to integrated circuits and, and particularly, but not by way of limitation, to digital modulation techniques for use within a single integrated circuit or between multiple integrated circuits.

BACKGROUND

Isolated analog-to-digital converters (ADCs) are used in a number of applications, for example, where sensors, motors, or other components operate at a different voltage level than related information processing.

SUMMARY

Various examples described herein are directed to an isolated analog-to-digital converter (ADC) circuit. The isolated ADC circuit comprises first and second isolated sides of the isolated ADC circuit. The first side and the second side may be separated by an isolator that provides a digital signal path between the first side and the second side. The first side and the second side may operate at isolated voltage domains. An ADC is positioned on the first side of the circuit. The ADC is configured to convert an analog signal to a multi-bit digital signal. A digital modulator on the first side is configured to convert the multi-bit digital signal to a single-bit stream. The single-bit stream may be transmitted across the isolator to a filter on the second side. The filter receives the single-bit stream and generates a reconstructed multi-bit digital signal on the second side.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
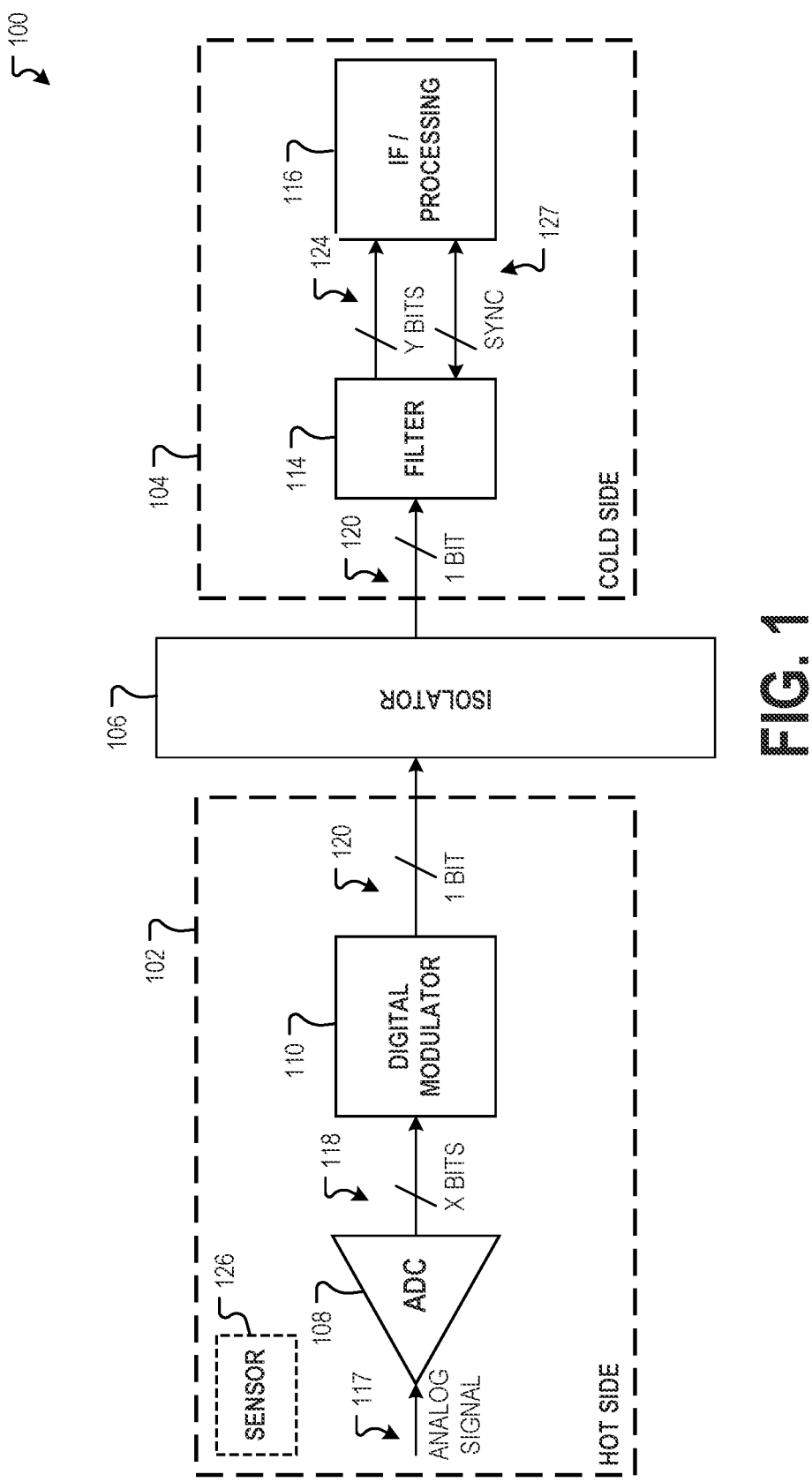
FIG. 1 is a diagram showing one example of an isolated ADC circuit.

An isolated ADC circuit, as described herein, comprises at least a hot side and a cold side. The hot side and cold side are galvanically isolated from one another and may operate at different voltages and/or be referenced to different grounds. For example, an isolated ADC circuit may have a hot side with an ADC that is powered at a voltage (e.g., 3.3 volts) that is referenced to the line voltage of a power transmission or delivery line (e.g., 120V RMS 230V RMS, 440V RMS or a DC Voltage such as +/−270V or 48V or 1000V). In this way, the ADC at the hot side may directly measure the current in a shunt that is series with the delivery or transmission line. The example isolated ADC circuit also has a cold side that is referenced to a different ground (e.g., the neutral line, earth, a floating voltage, etc.). The supply voltage for the cold side electronics may be at a lower voltage for digital processing (e.g., 1.8V, 1.2V, etc.) and/or a high voltage for actuation or display or communications (e.g. 12V, 5V or 3.3V).

Isolation between the hot and cold sides is provided by an isolator. Any suitable isolator may be used. Example isolators that may be use isolation mechanisms such as a transformer or other inductive isolator, a capacitive isolator, an optical isolator, etc. The isolator may include transmit and receive circuitry either side of the isolation mechanism that will be able to withstand constant and surge voltages without breaking down. In some examples, the isolation technology may be optimized to some degree to reject EMC and other transient events, but because of stray coupling mechanisms and imbalances it is possible for surges and/or electrical fast transient events to corrupt the data being sent across the isolators. In some examples, it is desirable for systems that use isolators, such as isolated ADC circuits, to be tolerant to this type of corruption.

In some examples, inductive isolator mechanisms may be selected to transmit power from the cold side to the hot side. This can be beneficial to power the function on the hot side even if the efficiency of the power transmitted is low. In systems optimized to use isolated power, power consumption on the hot side effectively 'costs' more than on the cold side due to this inefficiency and so it is often desirable to minimize it.

The hot and cold sides, in some examples are implemented on separate semiconductor dies (e.g., silicon dies). A hot side die and a cold side die may be packaged in a common integrated circuit package or implemented in separate integrated circuit packages. The isolator may be positioned on the hot side die, on the cold side die, on a separate, additional die or combinations thereof. In some examples, when the hot side die and cold side die are included in a common integrated circuit package. For example, the dies may be on separate lead frame sections or separate sections of a planar substrate or a stacked-die design could be used, where the hot side and cold side dies are stacked upon one another with a suitable isolation component between.

Communicating digital data between isolated sides of an isolated ADC circuit can present a considerable challenge. In some examples, an ADC on the hot side of an isolated ADC circuit itself generates a single-bit stream of digital signal that is unframed, for example from a single bit second order sigma-delta ADC. The single-bit digital signal can then be transmitted across the isolator to the cold side. There, the single-bit digital signal can be framed using a filter or other suitable filter to generate a multi-bit digital value that can be resampled at an appropriate rate. In this way, the single-bit digital signal is transmitted without a corresponding clock or synchronization signal but a higher resolution lower frequency value be recovered.

It may be desirable to use an ADC on the hot side that generates a multi-bit digital signal (e.g., a 4-bit digital signal) as output. A multi-bit ADC may provide benefits over a single-bit ADC such as, for example, higher resolution, better power efficiency or higher data rate, etc. For example, a multi-bit ADC may achieve higher SNR with a lower oversampling rate and may improve the power efficiency of the isolated ADC circuit For example a second order sigma-delta converter with 4-bit quantizer may be used on the hot side to create a multi-bit digital signal with a word size of 4-bits. If the multi-bit digital signal is filtered and decimated on the hot side to create the desired lower data-rate higher resolution value, then to determine the phase of this decimation a synchronization signal would need to be sent across the barrier from the cold side to the hot side.

A requirement to synchronize the phase of decimation is often needed in electrical measurement systems to guarantee the relative phasing between sampling the different current and voltage channels to determine correctly active and reactive power. Sending a signal across the isolation in the opposite direction to the data often incurs additional cost and complexity. For example, it may require an additional channel of isolation with associated high voltage passive and transmit and receive circuitry. In addition, if during operation there is an electromagnetic interference (EMI) event that causes corruption of this synchronization signal, the effect on the signal integrity could be large, as it may take several periods to recover. Another approach which would keep the filtering and decimation on the cold side would be to use multiple channels of isolation for transmitting the multi-bit digital signal from the hot side to the cold side. This, however, would increase cost, size and power. Another approach would be to frame the multi-bit digital signal with start and stop sequences and send it over a single channel. However, this would require a higher clock speed for the extra start-stop sequences. If there was corruption from an EMI event it could potentially corrupt one of the more significant bits increasing the error.

The previous examples were for oversampling converters, and although these run at a relatively high sampling rate, the latency to get a higher resolution value out of the signal chain is often determined by the filtering and decimation. In many applications low latency is desirable. Consider an energy measurement example including circuit breakers and protective relays. Here, latency may affect the speed at which faults can be detected and remedied.

When a multi-bit ADC is used on the hot side, it may be challenging to send the resulting multi-bit data across the isolator, for example, while maintaining resilience and flexibility in terms of synchronization. The ADC output signal generated by a multi-bit ADC is framed. That is, the ADC output signal includes discrete digital words with each digital word including multiple bits (e.g., 4 bits, 8 bits, 12 bits, etc.). Transmitting the ADC output signal across the isolator involves sending the ADC output signal itself as well as communicating a clock or other synchronization signal that allows a receiving component on the cold side to recreate the digital words of the multi-bit signal. This increases the complexity of the isolator and, in some examples, leads to the inclusion of multiple isolators between the hot and cold sides of the circuit. Sending the synchronization signal at the data rate of the ADC can also decrease efficiency.

Some examples utilize a framing scheme to organize the multi-bit digital signal output by the ADC for transmission across a single channel isolator for transfer to a cold side. A framing scheme, however, may introduce additional overhead. For example, in ADC designs that oversimple the analog input, such as delta-sigma ADCs, the ADC data may be at the higher ADC data rate, which may not be power efficient.

Further, when data is transmitted across an isolator, framed and/or synchronized arrangements can be vulnerable to interference or other sources of noise. Isolators, in some examples, are susceptible to noise caused by Electromagnetic interference (EMI) and/or other factors. A multi-bit signal transmitted across an isolator may be more vulnerable to noise at the isolator. For example, a single bit flip in a multi-bit digital signal can change the value of a digital word by as much as 50%. Further, in a framing scheme, corruption of just a few bits can lead to several frames lost data.

A multi-bit ADC on the hot side of an isolated ADC circuit may include a digital modulator on the hot side. The digital modulator converts the ADC output signal generated by the ADC to a single-bit stream that may be unframed. For example, the single-bit stream may include a series of logic 1's and 0's where the value of the single-bit stream is given by proportion of 1's and 0's. The single-bit stream is transmitted across the isolator to the cold side of the isolated ADC circuit. A filter on the cold side combines the received single-bit stream to generate a reconstructed ADC output signal. In this way, the ADC output signal generated by the multi-bit ADC is transmitted across the isolator, for example, without the need to also transmit a clock signal or other synchronization information.

The reconstructed ADC output signal may be at a higher resolution than the ADC output signal. In some examples, the reconstructed ADC output signal is decimated to the desired output frequency and synchronized to be at the desired phase needed at the output of the isolated ADC circuit. Also as each bit in the single-bit bitstream from the digital modulator has equal weighting and because of the high data rate, any corruption of a single bit only has minimal impact on the subsequent SNR and does not affect the resynchronization. In this way the above system may benefit from the superior ADC characteristics of SNR or power efficiency or bandwidth of a multi-bit ADC while benefiting from the efficiency and resilience and synchronization flexibility of a single-bit converter with minimal additional latency.

In some examples, it is desirable to communicate other information from the hot side to the cold side of an isolated ADC circuit. For example, the ADC may generate status and/or control information that is desirable to process on the cold side or transmit to other components from the cold side. Various examples herein also describe systems and methods for modulating additional data onto a signal transmitted across the isolator. For example, a digital data signal may be amplitude modulated onto a carrier signal to generate a modulated data signal. A carrier frequency of the carrier signal is higher than and, in some examples, much higher than the frequency of the ADC output signal transmitted across the isolator. For example, the carrier frequency may be at about the $200^{th}$ harmonic of the frequency of the ADC output signal, well beyond the frequency of interest and in the frequency range that will normally be filtered out. The modulated data signal is embedded (e.g., additively) to the ADC output signal and transmitted across the isolator.

FIG. 1 is a diagram showing one example of an isolated ADC circuit 100. The isolated ADC circuit 100 includes a hot side 102 and a cold side 104 separated by an isolator 106. The hot side 102 and cold side 104 are galvanically isolated from one another. In some examples, the hot side 102 and cold side 104 are implemented on separate dies. For example, the hot side 102 may be implemented on a first die and the cold side 104 may be implemented on a second die. The first and second dies may be included in a common integrated circuit package, for example, according to a stacked die structure. In other examples, the first and second dies are included in separate integrated circuit packages.

The hot side 102 includes an ADC 108 and a digital modulator 110. The ADC 108 may be of any suitable type. In some examples, the ADC 108 includes a multi-bit second order sigma-delta ADC. Also, in some examples, the ADC 108 includes a multi-bit Successive Approximation Register (SAR) ADC, or any other suitable multi-bit ADC. The ADC 108 converts an analog signal 117 to a multi-bit ADC output signal 118. The analog signal 117 may originate from any suitable source. In some examples, the hot side 102 also includes one or more sensors 126. The sensor 126, for example, may sense current, voltage, temperature, or another suitable value on the first side of the circuit. In some examples, the sensor 126 measures current or voltage at a power transmission line or other high-voltage application.

The ADC output signal 118 is provided to the digital modulator 110 on the hot side 102. In some examples, the ADC output signal 118 is filtered before being provided to the digital modulator. A low-pass filter may be used to remove part of the high frequency spectrum of the ADC to remove high frequency artifacts of the ADC conversion process. The digital modulator 110 converts that ADC output signal 118 to a single-bit stream 120. This removes framing data. For example, the ADC output signal 118 comprises discrete digital words. On the other hand, the single-bit stream 120 includes a stream of logic 1's and 0's where the value is conveyed by the proportion of the time that the stream 120 has a particular logic value. In some examples, converting the ADC output signal 118 to a single-bit stream 120 includes modifying the data rate. For example, the single-bit stream 120 may have a data rate higher than a data rate of the ADC output signal. In some examples, a data rate increase at the digital modulator 110 is proportional to the number of bits in the ADC output signal 118. For example, if the ADC output signal 118 includes 4-bit words, the data rate of the single-bit stream 120 may be four time higher than a data rate of the ADC output signal 118. In some examples the modulator may reduce the net data rate if the ADC 108 is sampling at a higher rate than is needed for the frequencies of interest, for example to improve the anti-aliasing of the system.

The digital modulator 110 may be of any suitable type. In some examples, the digital modulator 110 includes a sigma-delta modulator. In some examples, such as examples where the ADC is a sigma-delta ADC, the ADC 108 itself may include a n analog modulator. The digital modulator 110 may therefore be in addition to the analog modulator, if any, that is part of the ADC 108. For example, the digital modulator 110 may act on the ADC output signal 118 generated by the ADC 108.

The single-bit stream 120 is transmitted across the isolator 106 to the cold side 104. The isolator 106 may be or include any suitable type of isolator device such as, for example, one or more transformers or other inductive isolator devices, one or more capacitors or other capacitive isolator devices, one or more optical isolators, etc. At the cold side 104, the single-bit stream 120 is provided to a filter 114. At the cold side 104 (e.g., after being transmitted across the isolator 106, the single-bit stream 120 may be referenced to a ground of the cold side 104.

The filter 114 average the single-bit stream 120 to generate a reconstructed ADC output signal 124. The reconstructed ADC output signal 124 is a reconstruction on the cold side 104 of the original multi-bit signal 118 generated by the ADC 108. The reconstructed ADC output signal 124 may have words of any suitable length (e.g., in bits). In some examples, the reconstructed ADC output signal 124 has words of the same length as the words of the ADC output signal 118. In other examples, the word length of the reconstructed ADC output signal 124 may be different than that of the ADC output signal 118. The data rate of the reconstructed ADC output signal 124 may be lower than the data rate of the single-bit stream 120, for example, by a factor related to the word length of the reconstructed ADC output signal 124 and the order and frequency of operation of the digital modulators.

The filter 114, for example, may comprise one or more digital filters, one or more digital integrators, etc. For example, the filter 114 may include a digital sine filter, a progressive cascaded integrator-comb (CIC) filter, or any other suitable filter. The filter 114 may also receive a synchronization signal 127. For example, the synchronization signal 127 may be a clock signal used by one or more digital filters implemented by the filter 114. In some examples, the synchronization signal 127 is generated by another component, such as the interface or processing circuit 116 circuit, and provided to the filter 114. The reconstructed ADC output signal 124 and synchronization signal 127 are provided to and by an interface/processing circuit 116. The interface/processing circuit 116 may process the reconstructed ADC output signal 124 and/or transmit it to a remote circuit or device for processing. For example, when the reconstructed ADC output signal 124 represents a sensor output, the interface/processing circuit 116 (or other remote circuit or device) may process the reconstructed ADC output signal 124 to calculate frequency components, calculate averages, combine with other data, be scaled, detect errors, record values, etc.

Although one filter 114 is shown in FIG. 1, some examples may include multiple filters on the cold side 104. For example, a first filter may have a relatively low latency and a relatively low precision. The second filter may have a relatively higher latency and relatively higher precision. The high-latency, high-precision filter may be used, for example, for data recordation. The low-latency, low precision filter may be used, for example, to quickly detect error conditions.

Figure 2:
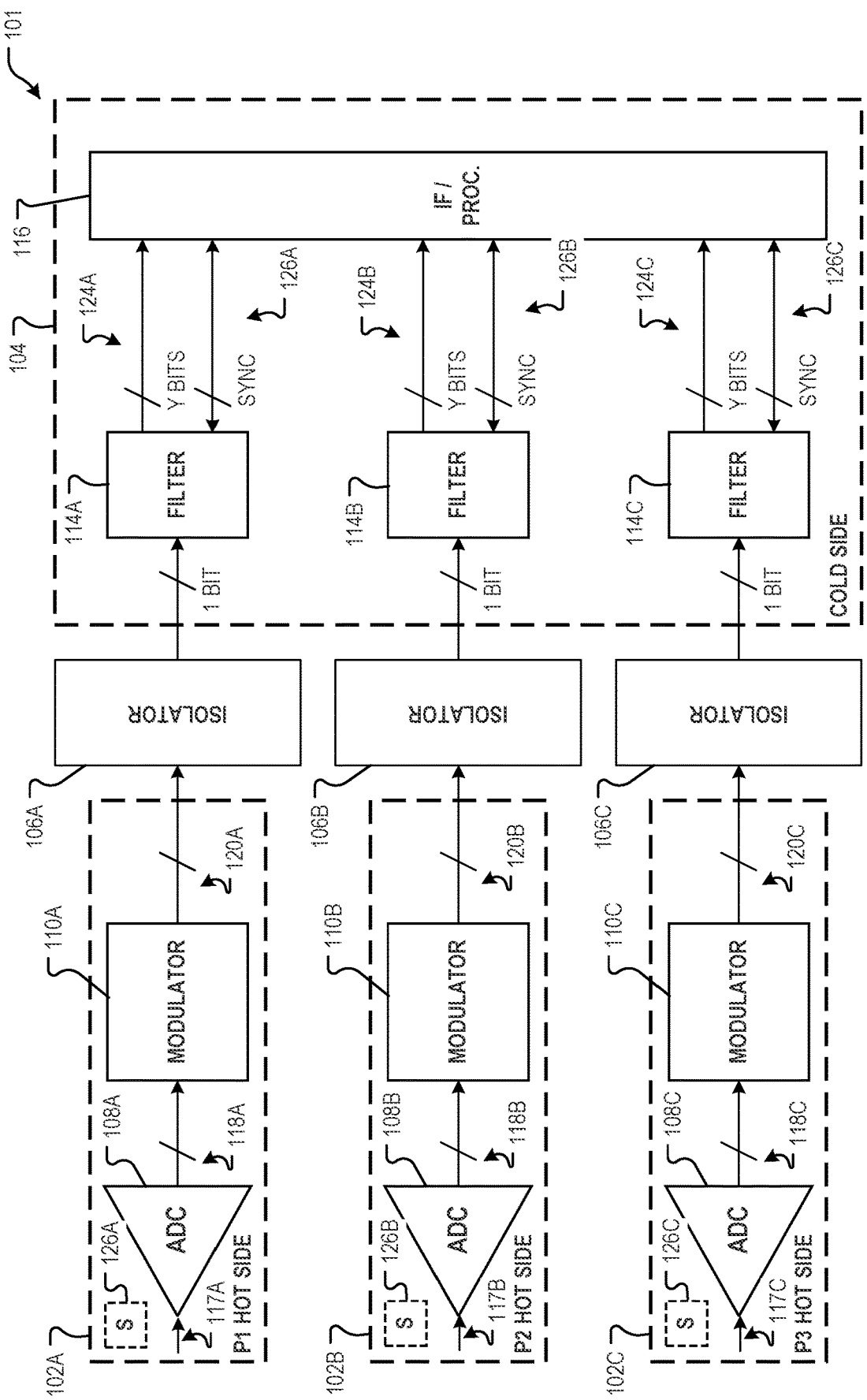
FIG. 2 is a diagram showing another example of an isolated ADC circuit including multiple hot sides.

FIG. 2 is a diagram showing another example of an isolated ADC circuit 101 including multiple hot sides 102A, 102B 102C. The hot sides 102A, 102B, 102C may be implemented on separate dies from the cold side 104 and, in some examples, separate dies from each other. Each hot side 102A, 102B, 102C comprises an optional sensor 126A, 126B, 126C, ADC 108A, 108B, 108C, and digital modulator 110A, 110B, 110C. In the isolated ADC circuit 101, the respective hot sides 102A, 102B, 102C operate similar to the hot side 102 to generate respective single-bit streams 120A, 120B, 120C that are provided across isolators 106A, 106B, 106C to the cold side 104. For example, the ADCs 108A, 108B, 108C receive respective analog signals 117A, 117B, 117C. Analog signals 117A, 117B, 117C may be received from optional sensors 126A, 126B, 126C. The ADCs 108 convert the analog signals 117A, 117B, 117C to respective ADC output signals 118A, 118B, 118C that are provided to respective modulators 110A, 110B, 110C. Modulators 110A, 110B, 110C convert the respective ADC output signals 118A, 118B, 118C to respective single-bit streams 120A, 120B, 120C that are transmitted across respective isolators 106A, 106B, 106C to the cold side 104.

The cold side 104 includes respective filters 114A, 114B, 114C that convert the respective multi-bit signals 120A, 120B, 120N to respective reconstructed ADC output signals 124A, 124B, 124C using synchronization signals 127A, 127B, 127C. Three synchronization signals 127A, 127B, 127C are shown in FIG. 2. In some examples, this allows for the insertion of different phase delay between the different channels, for example to cancel phase errors in the sensor analog part on each channel. Also, in some examples, two or more of the quantizers 114A, 114B, 114C operate using the same synchronization signal.

An arrangement such as the example of FIG. 2 with three hot sides 102A, 102B, 102C may be used, in some examples, for implementations that monitor a device or transmission line using or transporting a three-phase signal. In a multi-phase system there may be more than one hot side for each cold side. In the example of FIG. 2, there are three hot sides 102A, 102B, 102C to one common cold-side 104 at the neutral (e.g., one hot side at each of the 3 phases). Also, although three hot sides 102A, 102B, 102C are shown, arrangements with any suitable number of hot sides may be used in some examples.

Figure 3:
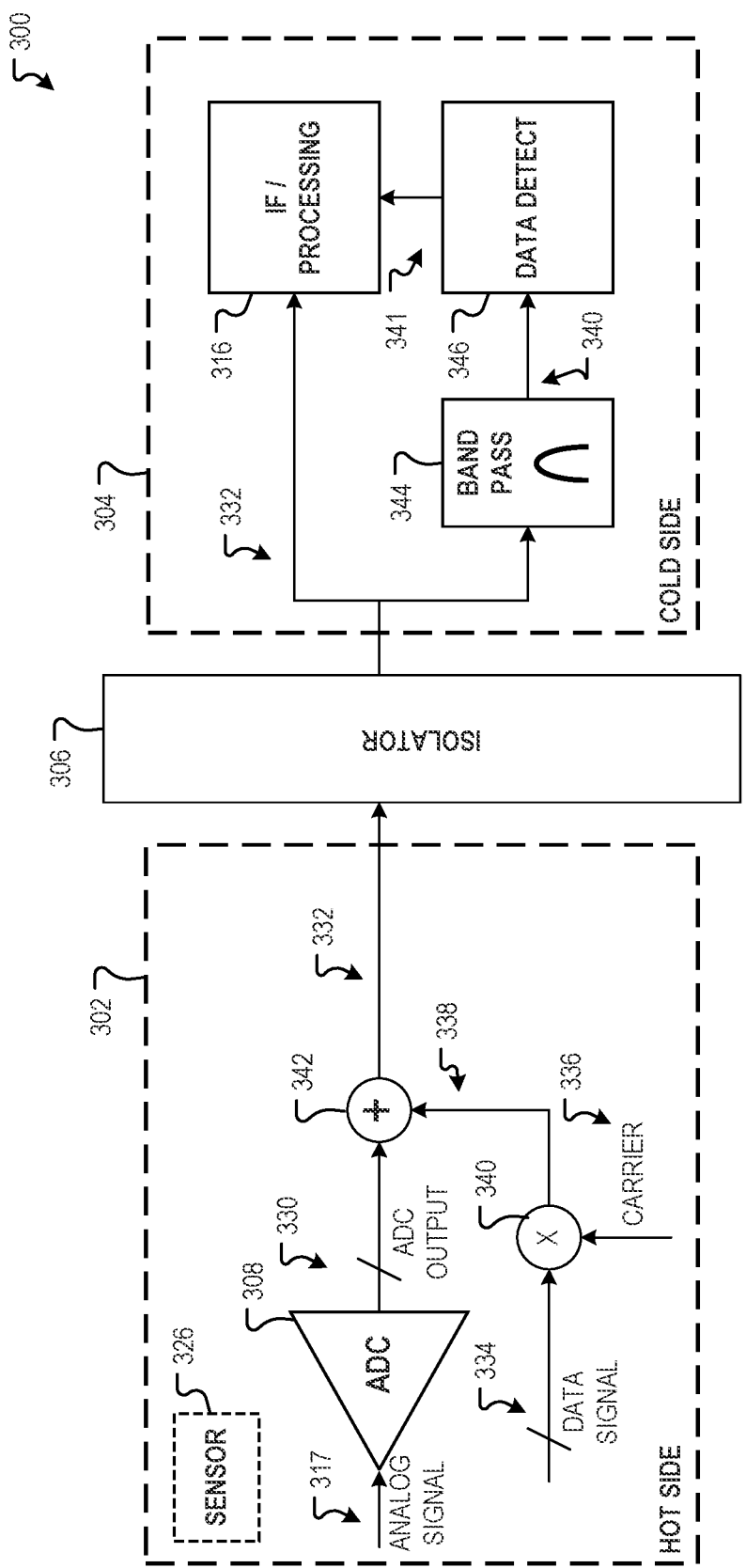
FIG. 3 is a diagram showing one example of an isolated ADC circuit that is configured to transmit a modulated data signal embedded with the ADC output across the isolator.

FIG. 3 is a diagram showing one example of an isolated ADC circuit 300 that is configured to transmit a modulated data signal embedded with the ADC output across the isolator 306. Similar to the isolated ADC circuits 100, 101, the isolated ADC circuit 300 includes a hot side 302 and a cold side 304 separated by an isolator 306.

In the example of FIG. 3, the hot side 302 includes an ADC 308 that converts an analog signal 317 to an ADC output signal 330. The ADC output signal 330 may be multi-bit, similar to the ADC output signals 118, 118A, 118B, 118C, or may be single bit. The hot side 302 also includes a digital data signal 334. The digital data signal 334 includes digital data generated on the hot side 302 that is to be transmitted to the cold side 304. For example, the digital data signal 334 may include register values from the optional sensor 326, control data generated by the ADC 308, or any other suitable data.

The digital data signal is modulated onto a carrier signal 336 at modulator 342 to generate a modulated data signal 338. The carrier signal 336 has a carrier frequency that may be higher than a threshold harmonic of the data rate of the ADC output signal 330. For example, the band of interest of the ADC maybe up to the $50^{th}$ harmonic and the carrier frequency may be higher than the $200^{th}$ harmonic of the data rate of the ADC output 330. In this way, adding the modulated data signal 338 is out-of-band relative to the ADC output 330. Accordingly, adding the modulated data signal 338 to the ADC output signal 330 may result in a small reduction in the signal-to-noise (SNR) ratio in-band.

Figure 4:
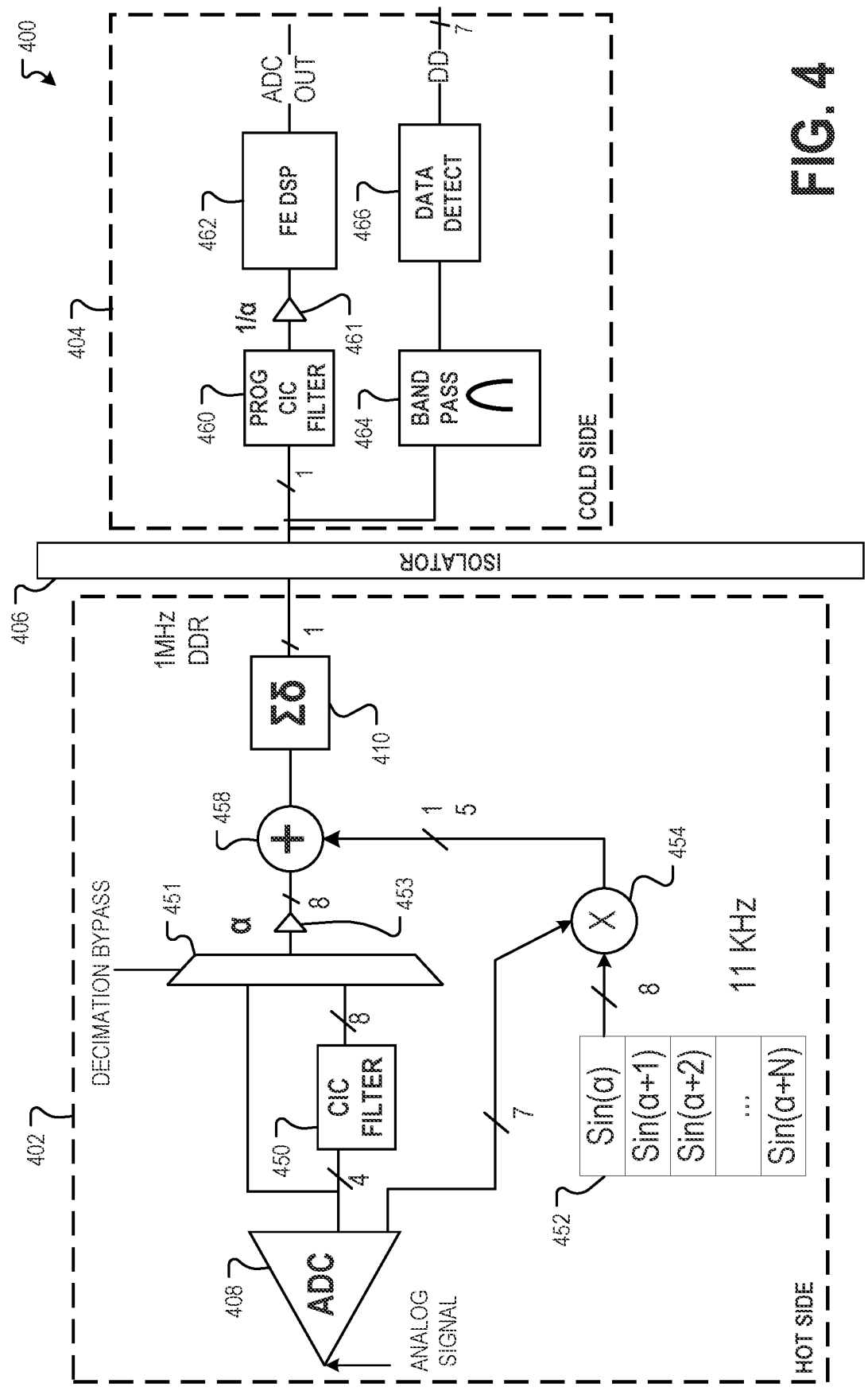
FIG. 4 is a diagram showing one example of an isolated ADC circuit for embedding a data signal and transmitting a single-bit data stream over an isolator.

The modulated data signal 338 is additively embedded on the ADC output 330 at adder 342, resulting in an embedded ADC output signal 332. The embedded ADC output signal 332 is transmitted across the isolator 306 to the cold side 304. In some examples, the isolated ADC circuit 300 utilizes a single-bit ADC and/or converts a ADC output signal from the ADC 308 to a single-bit stream prior to transmission across the isolator 306, as shown in FIGS. 1-2 and 4. In other examples, the embedded ADC output signal 332 is a multi-bit signal and synchronization data is transmitted with the embedded ADC output signal 332 and/or reconstructed on the cold side 304.

On the cold side, the embedded ADC output signal 332 is received by an interface/processing circuit 316 that may process and/or transmit the embedded ADC output signal 332 to another device for processing. In some examples, the interface/processing circuit 316, or other suitable component, applies low-pass filtering to the embedded ADC output signal 332 to remove the embedded modulated data signal 338 prior to processing or transfer to another device for processing.

The embedded ADC output signal 332 is also provided to a bandpass filter 344. The bandpass filter 344 may have a passband centered on the carrier frequency of the carrier signal 336. A filtered signal 340 may include frequency content from the embedded ADC output signal 332 including the modulated data signal 334. A data detection circuit 346 may demodulate the filtered signal 340 to generate a reconstructed data signal 341. The reconstructed data signal 341, in some examples, is provided to the interface/processing circuit 316. In some examples, the data detection circuit 346 utilizes a peak detect mechanism, an angle tracking mechanism or a combination of both approaches.

FIG. 4 is a diagram showing one example of an isolated ADC circuit 400 for embedding a data signal and transmitting a single-bit data stream over an isolator 406. For example, the isolated ADC circuit 400 includes features of both the isolated ADC circuit 100 of FIG. 1 and the isolated ADC circuit 300 of FIG. 3. The isolated ADC circuit 400 includes a hot side 402 and a cold side 404 separated by an isolator 406. The hot side 402, cold side 404, and isolator 406 may be implemented, for example, as described herein with respect to other hot sides, cold sides, and isolators.

The hot side 402 includes an ADC 408. The ADC 408 may be a multi-bit ADC that converts an analog signal to a multi-bit ADC output signal. The ADC 408, in some examples, includes a multi-bit, $2^{nd}$ order sigma-delta ADC, a SAR ADC, or other suitable ADC. In the example of FIG. 4, the ADC output signal generated by the ADC 408 includes words with a 4-bit word length. The ADC output signal may include, for example, quantizer data from the flash converter in the modulator, data (e.g., 4-bit data) from an analog sigma delta converter, etc.

The example isolated ADC circuit 400 of FIG. 4 includes optional components 450, 451 for decimating the ADC output signal on the hot side 402. Decimating on the hot side 402 (e.g., before data is transferred to the cold side 404) is desirable in some uses, but not in others. For example, decimating on the hot side 402, may introduce additional latencies into the circuit 400 that make the hot side decimation unsuitable for some applications. In other examples, the ADC output signal is transferred from the hot side 402 to the cold side 404 without having first been decimated. In the example of FIG. 4, decimation is performed by a CIC filter 450, which may act as a decimator. The CIC filter 450 receives the ADC output signal and generates a decimated ADC output signal, which may be multi-bit. Decimating the ADC output signal, in some examples, reduces its data rate and may also, in some examples, increases its word length. In the example of FIG. 4, the CIC filter 450 reduces the data rate of the ADC output by half, but also doubles the word length from 4-bits to 8-bits.

As described, decimation of the ADC output signal may be desirable in some implementations but not in others. For example, use of limited or no decimation may decrease latency, which may be important for some applications. Accordingly, in the example of FIG. 4, both the ADC output signal and the decimated ADC output signal are provided to a multiplexer 451. A decimation bypass input is provided to the multiplexer 451. At its output, the multiplexer 451 provides the ADC output signal or the decimated ADC output signal depending on the state of the decimation bypass signal. An optional multiplier 453 multiplies the output of the multiplexer 451 by a gain given by α. This can be to equalize the data depending on the path it took, or to maximize the dynamic going into the digital modulator 410.

The example isolated ADC circuit 400 of FIG. 4 also includes components for embedding a digital data signal for transmission across the isolator. The embedding may be done by modulating the digital data signal to a high frequency carrier having a carrier frequency greater than a threshold harmonic of the data rate of the ADC output (e.g., the $200^{th}$ harmonic). In some examples, the digital data signal may be very slowly varying, may not have high frequency components. Accordingly, the digital data signal may be safely modulated on the carrier frequency, which is at a higher frequency. If the digital data signal is chattering, it may be filtered prior to modulation. Pre-modulation filtering may require additional area on the hot die and may also reduce latency performance, but this may be acceptable for some cases.

In the example of FIG. 4, the digital data signal originates from the ADC 408 and may include, for example, control data from the ADC 408 such as, for example, the state of a control register of the ADC 408, etc. In the example of FIG. 4, the digital data signal has a 7-bit word length. The digital data signal is modulated onto a carrier signal at a modulator 454. The carrier signal may have a carrier signal frequency that is higher than the data rate of the ADC output signal, and in some examples, much higher. For example, the carrier signal may have a carrier signal frequency that is at or above a threshold harmonic of the data rate of the ADC output such as, for example, above the $200^{th}$ harmonic. In some examples, the carrier is selected to permit multiple harmonics of the carrier tone to be used to send more bits with varying dynamic range of control code. The carrier signal may be low energy. For example, the energy of the carrier signal may be 40 dB or more lower than the energy of the ADC output signal. In some examples, the energy of the carrier signal is lower than the energy of the ADC output signal by 60 dB or more, 80 dB or more, etc.

A sine wave look-up table (LUT) 452 is used, in this example, to produce the carrier signal. The LUT 452, in some examples, is accessed at the decimation rate of the CIC filter 450, which may be 500 kHz. In this example, the carrier signal has an 8-bit word length. The modulated data signal generated by the combination of the 7-bit digital data signal and the 8-bit carrier signal has a 15-bit word length. The bandwidth of the modulated data signal, in this example, is 11 kHz.

The modulated data signal is additively combined with the output of the amplifier 453 at adder 458. Embedding of the control data in an additive manner, as described herein, may cause a small to negligible degradation the signal-to-noise ratio (SNR) in-band, but may also cause a slight loss in dynamic range of the ADC data. For example, the modulated data signal may have a suitably small bandwidth (11 kHz in this example), and be positioned above the threshold harmonic to reduce its contribution to the SNR. Also, in some examples, the embedding of the control may be strategically placed, as described herein, such that suitable (e.g., maximum) code swing is achieved with clean detection under noisy scenarios.

The output of the adder 458 is provided to the digital modulator 410. In the example of FIG. 4, the digital modulator 410 includes a sigma-delta modulator. In various examples, the digital modulator 410 includes an all-digital cascade of integrator feedback (CIFF) dual data rate (DDR) modulator. Also, in some examples, the digital modulator 410 comprises a topology cascade of integrators with dual resonator feedback. In some examples, the arrangement may be a fifth-order arrangement, as described herein. Also, in some examples, the digital modulator provides higher-order noise shaping as described herein.

The output of the digital modulator 410 is the single-bit stream, which is transmitted across the isolator 406 to the cold side. The single-bit stream, as described herein, may not use a framing synchronization scheme with its attendant disadvantages.

On the cold side 404, the single-bit stream is provided to a filter 460. In the example of FIG. 4, the filter 460 includes a progressive CIC filter. The filter 460 converts the single-bit stream to a reconstructed multi-bit signal that represents the output of the ADC 408. An amplifier 461 may be applied to the reconstructed multi-bit signal. The gain of the amplifier (i/a) may be the inverse of the gain of the amplifier 453. The reconstructed multi-bit signal, in the example of FIG. 4, is provided to a front end digital signal processor (DSP) 462 for processing. In some examples, a communication interface may be included in addition to or instead of the front-end DSP 462 to transmit the reconstructed multi-bit digital signal to another component for processing.

The single-bit stream is also provided to a band pass filter 464 and data detection circuit 466 to extract the digital data signal embedded on the hot side 402. The band pass filter 464 is centered on the carrier frequency and may have a passband that is equivalent to the bandwidth of the modulated data signal generated by the hot-side modulator 454. In this example, the pass band of the band pass filter 464 may be about 11 kHz. An output of the bandpass filter 464 is passed to the data detection circuit 466, which may detect the original digital data signal by extracting the digital data signal from the combination of the carrier signal and the digital data signal.

In various examples, electrostatic discharge (ESD) and/or interference of high frequency components cause errors that can translate into bit errors. These errors can be of periodic nature or random nature with multiple bits being corrupted. Various examples described herein have acceptable loss in SNR for when the errors occur with no frequency deviation of the fundamental. On the control side the occurrence of errors should not cause significant (or any) corruption of the digital data signal embedded on the ADC output. For example, in some examples, the detection circuitry clean retrieves the digital data signal without loss in latency. When the errors go away, the SNR numbers may come back to normal. In some examples, the one-bit scheme described herein has no framing and, therefore, a corruption may never lead to a loss of multiple frames of data.

In some examples, embedding the digital data signal as described may raise the noise floor temporarily. This mechanism may make the receiver side cleanly detect the digital data signal without having to make decisions about the framing synchronization. Since the scheme employed is amplitude modulation the digital data signal can be recovered by either a peak detect mechanism or angle tracking mechanism or a combination of both.

Figure 5:
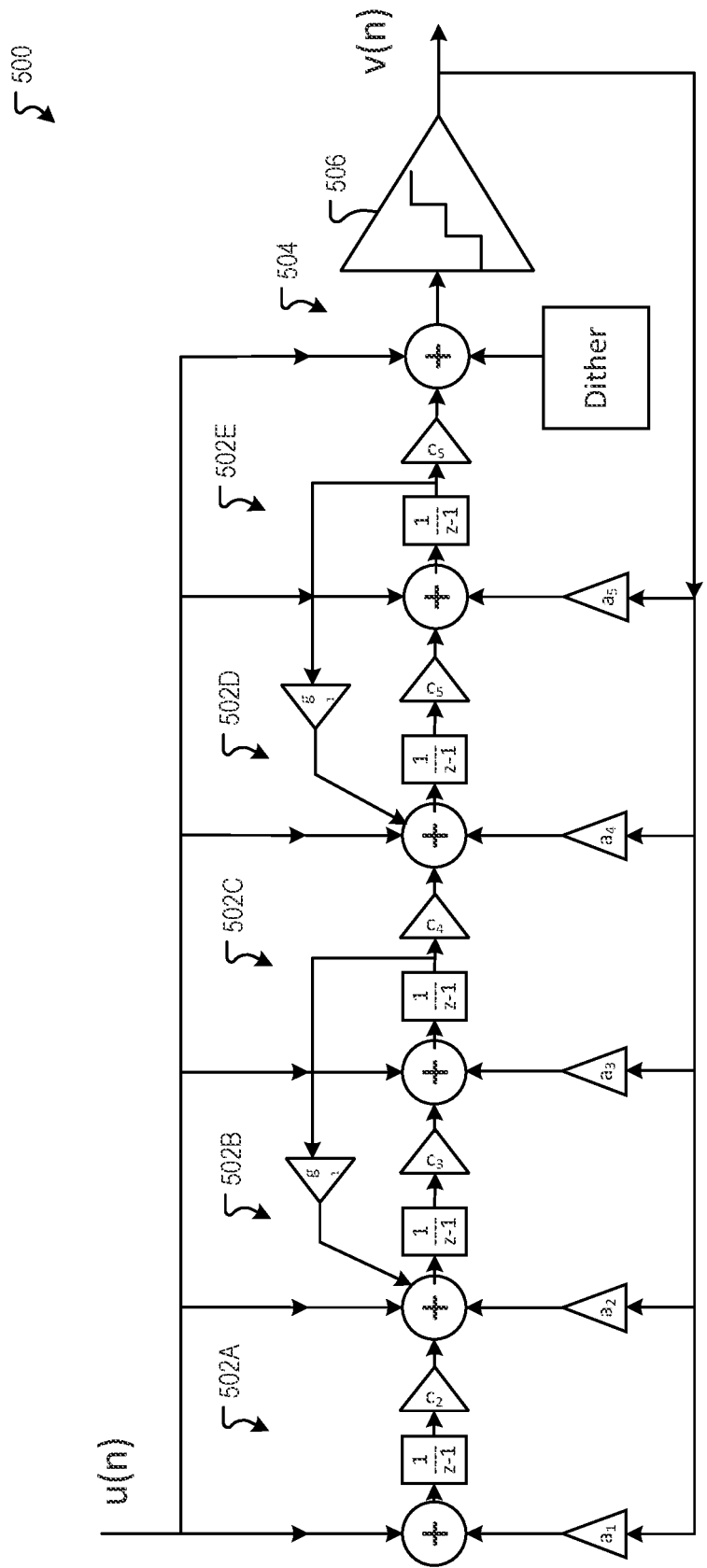
FIG. 5 is a diagram showing one example of a digital modulator that may be used to implement any of the digital modulators described herein.

FIG. 5 is a diagram showing one example of a digital modulator 500 that may be used to implement any of the digital modulators described herein. The example digital modulator circuit 500 is a sigma-delta modulator with cascaded integrator feedback. For example, the sigma-delta modulator may be implemented utilizing CIFF technology.

An input to the digital modulator 500, given by u(n), is a multi-bit digital signal. In the diagram of FIG. 5, the internal math of the digital modulator 500 is represented with digital 'analog' variables with appropriate bit width for the required mathematical precision in the form of an appropriate number system, for example floating point or scaled integer, signed or unsigned. The output of the digital modulator 500, given by v(n), is the single-bit stream described herein. The digital modulator 500 is a fifth-order modulator including five integrator stages 502A, 502B, 502C, 502D, 502E. The respective integrator stages 502A, 502B, 502C, 502D, 502E sum to the input u(n) and an analog variable version of the output v(n). Effective digital-to-analog converters (DACs) a1, a2, a3, a4, a5 convert the output v(n) to a digital analog variable for the respective integrator stages 502A, 502B, 502C, 502D, 502E. The sum at each stage 502A, 502B, 502C, 502D, 502E is fed into the following integrator, denoted as $(1/z-1)$, in the Z-domain transfer function and a stage-specific scaling factor c1, c2, c3, c4, c5 is applied. Integrator stages 502B and 502D add a feedback from the next integrator stages 502C and 502E, respectively. An optional dither stage 504 may be used to whiten the noise floor. The output of the integrator stages 502A, 502B, 502C, 502D, 502E and optional dither stage 504 is provided to a comparator 506 which generates the single-bit stream output v(n).

The digital modulator 500 may be optimized using iterative techniques to reduce integrator width. The resonator portions of the modulator may provide better performance with tradeoff of higher digital area. In some examples, optional resonators are used to create nulls in the noise band, which may result in better SNR parametric numbers.

Figure 6:
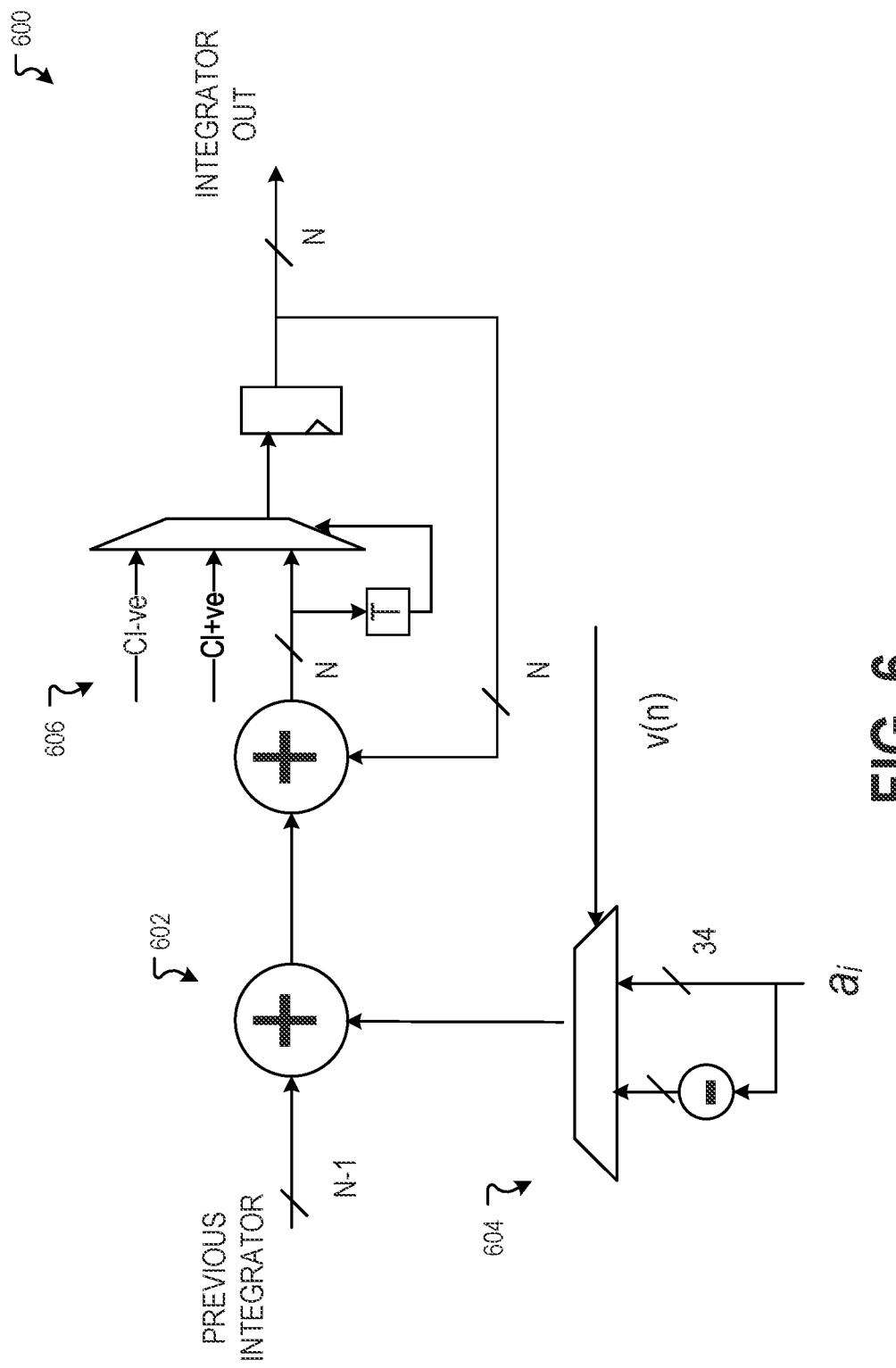
FIG. 6 is a diagram showing one example of an integrator stage including saturation logic.

FIG. 6 is a diagram showing one example of an integrator stage 600 including saturation logic. The integrator stage 600, for example, may be used to implement one or more of the integrator stages 502A, 502B, 502C, 502D, 502E of FIG. 5. The integrator stage 600 may be suitable for use in digital modulators that implement a CIFF scheme, as described herein.

In the integrator stage 600, a previous integrator output is summed with an output of a DAC 604 at summer 602. The modulator output v(n) controls the DAC 604. If the modulator output v(n) is high, the DAC 604 returns $-a_i$. If the modulator output v(n) is low, the DAC 604 returns $a_i$. A clipping stage 606 is configured to change the integrator stage output if the output of the summer 602 clips. To optimize the bit widths of the integrators, some examples may include analyzing the registered value of the output of the summer 602 to see how close it is to clip whether the signal overflow. Clipping points may be calculated and set as pre-set thresholds to avoid this condition from happening. In some examples, the clipping preset thresholds are built using hardwired logic. The block shown as T is a part selector as, in some examples, the entire bit-width does not need to be compared and comparing a section will suffice. When the summing signal is out-of-bounds with respect to the thresholds the integrator is held in saturation. This may have the effect of order reduction as no integration of the feedback is taking place. In some examples, truncation or rounding as shown in FIG. 6 is performed at the third integrator stage 502C, fourth integrator stage 502D, and fifth integrator stage 502E and not at the first two integrator stages 502A, 502B.

As described herein, the digital modulator increases the data rate of the single-bit stream relative to the data rate of the multi-bit signal input, for example, by oversampling at an over sampling rate (OSR). In some examples, the OSR of the modulator may be increased, for example, with signal transfer between hot side and cold side at a dual data rate (DDR). In some examples, such as when the ADC is a SAR ADC, a first clock, such as a 1 MHz clock, may be input to the hot side. Using standard cells, a second, higher-frequency clock, a 2 MHz clock is created and used to clock the hot side digital modulator. The OSR may be 20 for an example case where the first clock is at 1 MHz and the second clock is at 2 MHz. In some examples, such as some examples where a SAR ADC is used, 16× oversampling or better may yield no SNR degradation. The data may be transmitted using 2-bit lanes, which, in some examples, each have a bandwidth of 1 Mb/sec. On the receiver side, which is the cold side, the 2-bit lanes may be recovered back to 10 bits at 100 kHz.

Figure 7:
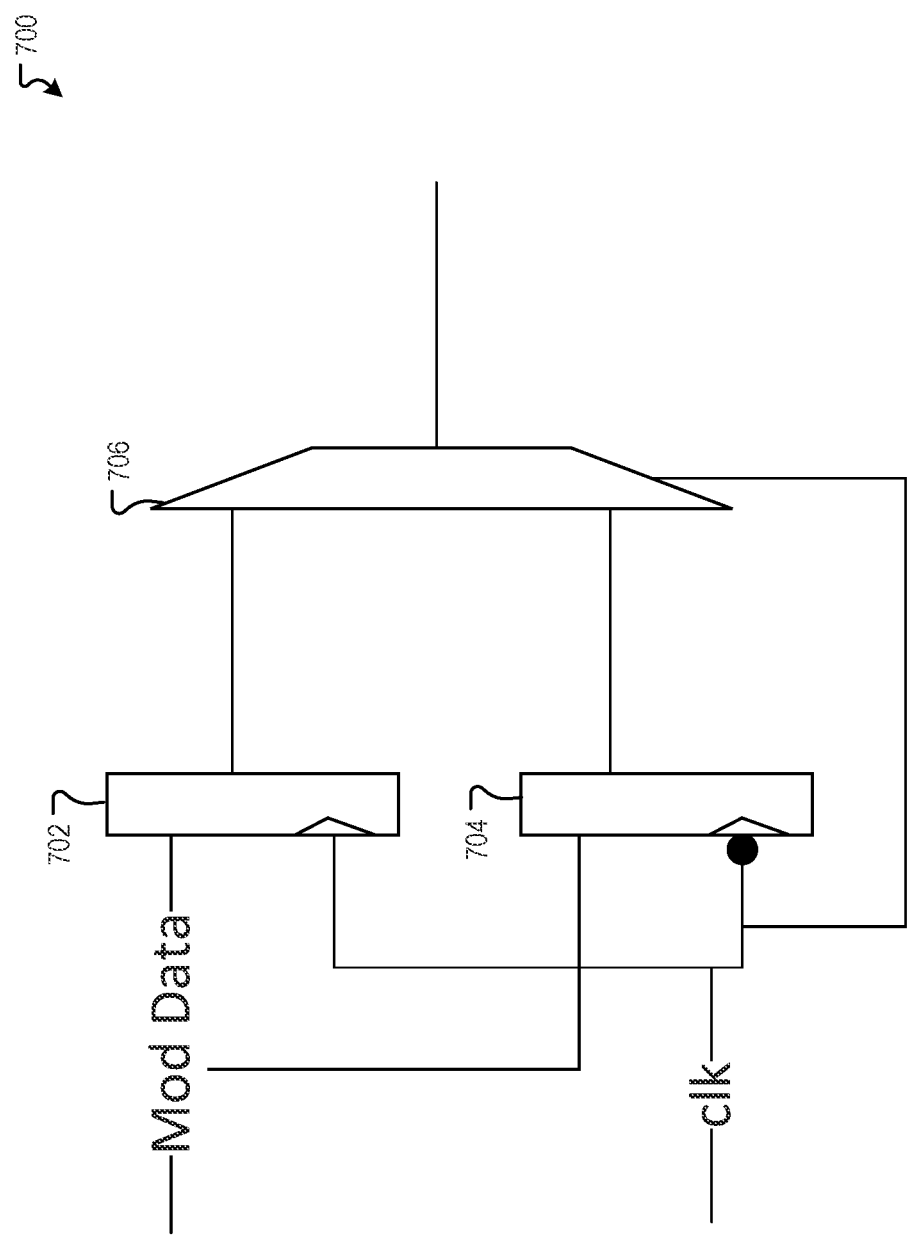
FIG. 7 is a diagram showing an example circuit including elements for increasing the over sampling rate (OSR) of the digital modulator using a dual data rate (DDR).

State elements may be employed to implement the dual data rate. For example, FIG. 7 is a diagram showing an example circuit 700 including elements for increasing the OSR of the digital modulator. In FIG. 7, the single-bit stream output by the digital modulator is provided to two flip-flops 702, 704. The flip-flop 702 receives a clock signal (clk) used by the ADC. The flip-flop 704 receives a complement of the clock signal. The outputs of the flip-flops 702, 704 are provided to a multiplexer 706. The output of the multiplexer is the over-sampled single-bit stream. The output of the multiplexer 706 is, alternatively, output of the flip-flop 702 or the output of the flip-flop 704, switching on transitions of the clock signal.

Figure 8:
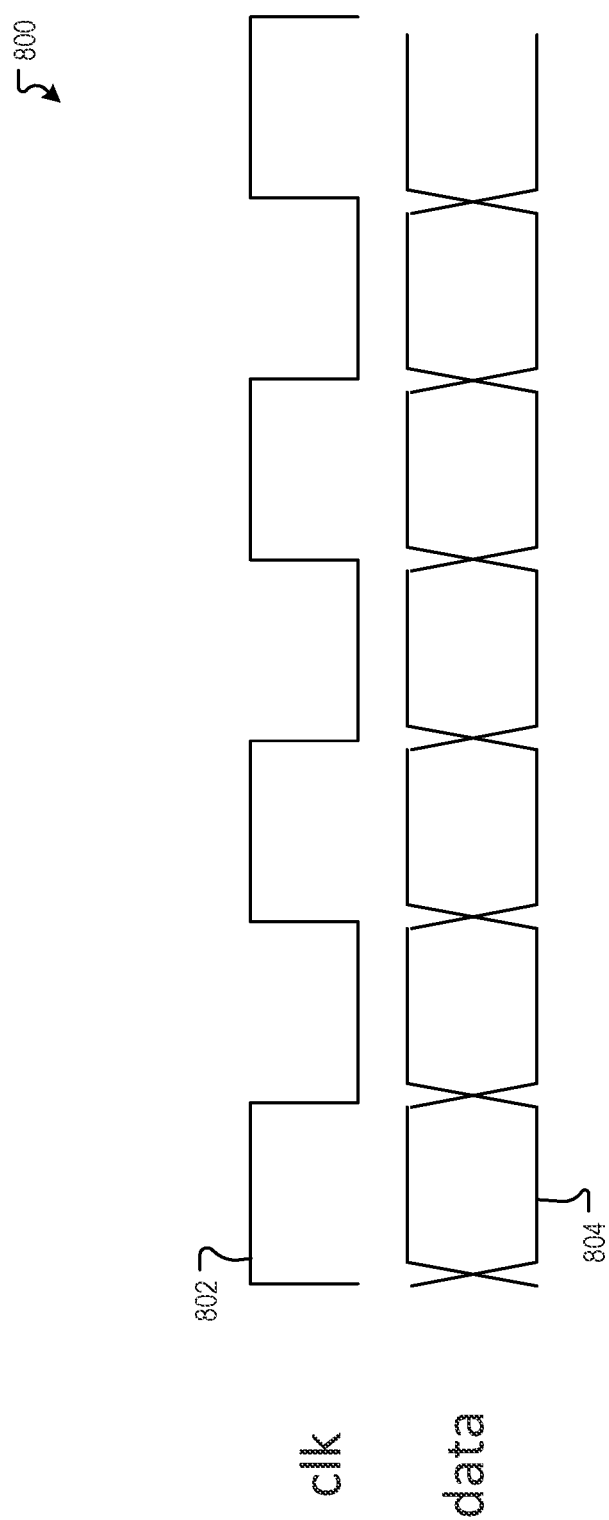
FIG. 8 is a timing diagram showing one example diagram of a clock signal and a data signal showing increased OSR using the arrangement of FIG. 7.

FIG. 8 is a timing diagram 800 showing one example diagram of a clock signal 802 and a data signal 804 showing increased OSR using the arrangement of FIG. 7. As shown, the data signal 804 is sampled on both the rising and the falling edges of the clock signal 802. The multiplexer 706 may be used to select between clocking on the positive edge of the clock signal, the negative edge of the clock signal, or both.

Figure 9:
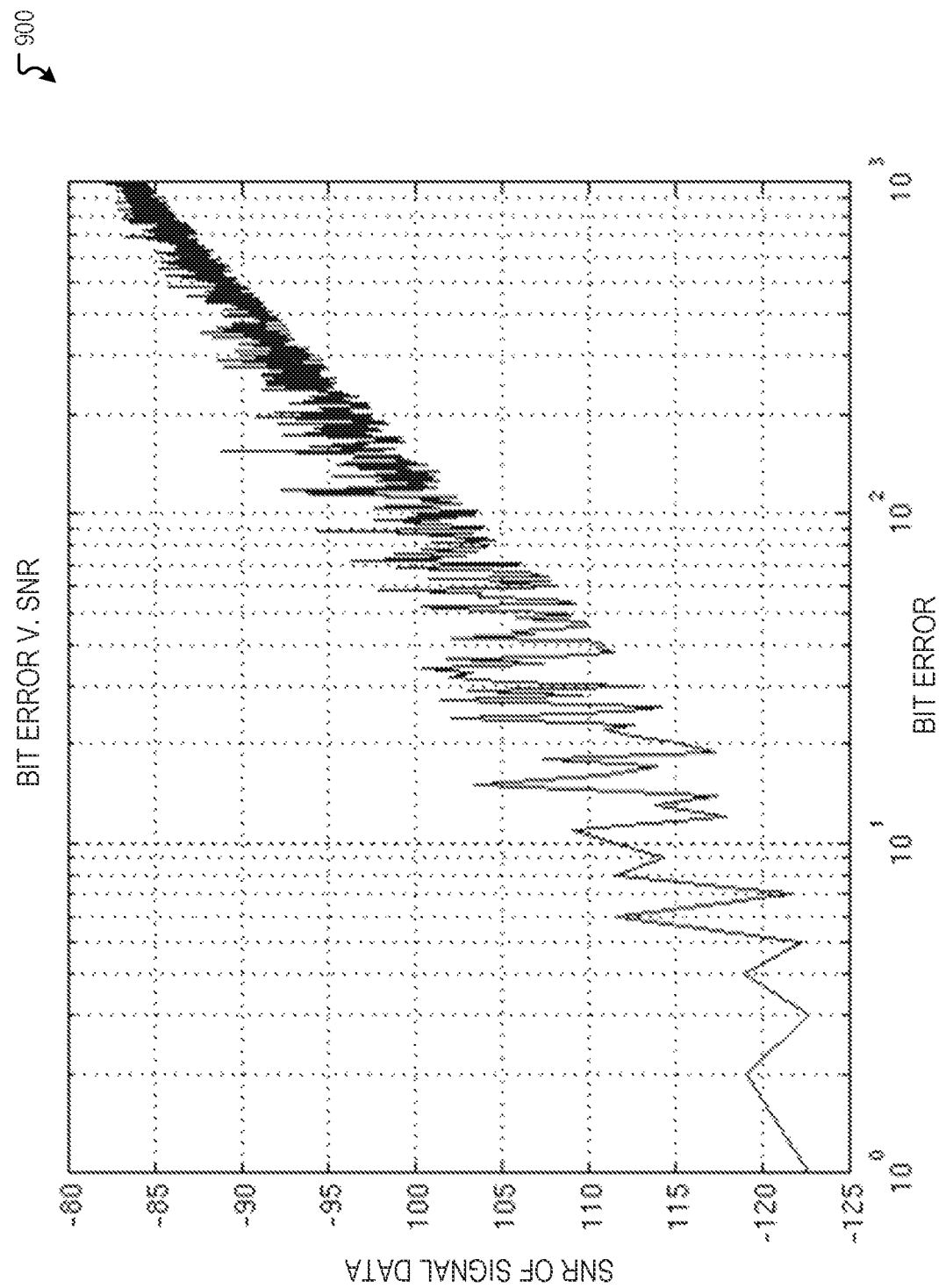
FIG. 9 is a plot showing bit errors versus signal to noise ratio for a single burst using the example isolated ADC circuit of FIG. 4, with bit errors indicated on a logarithmic scale.
Figure 10:
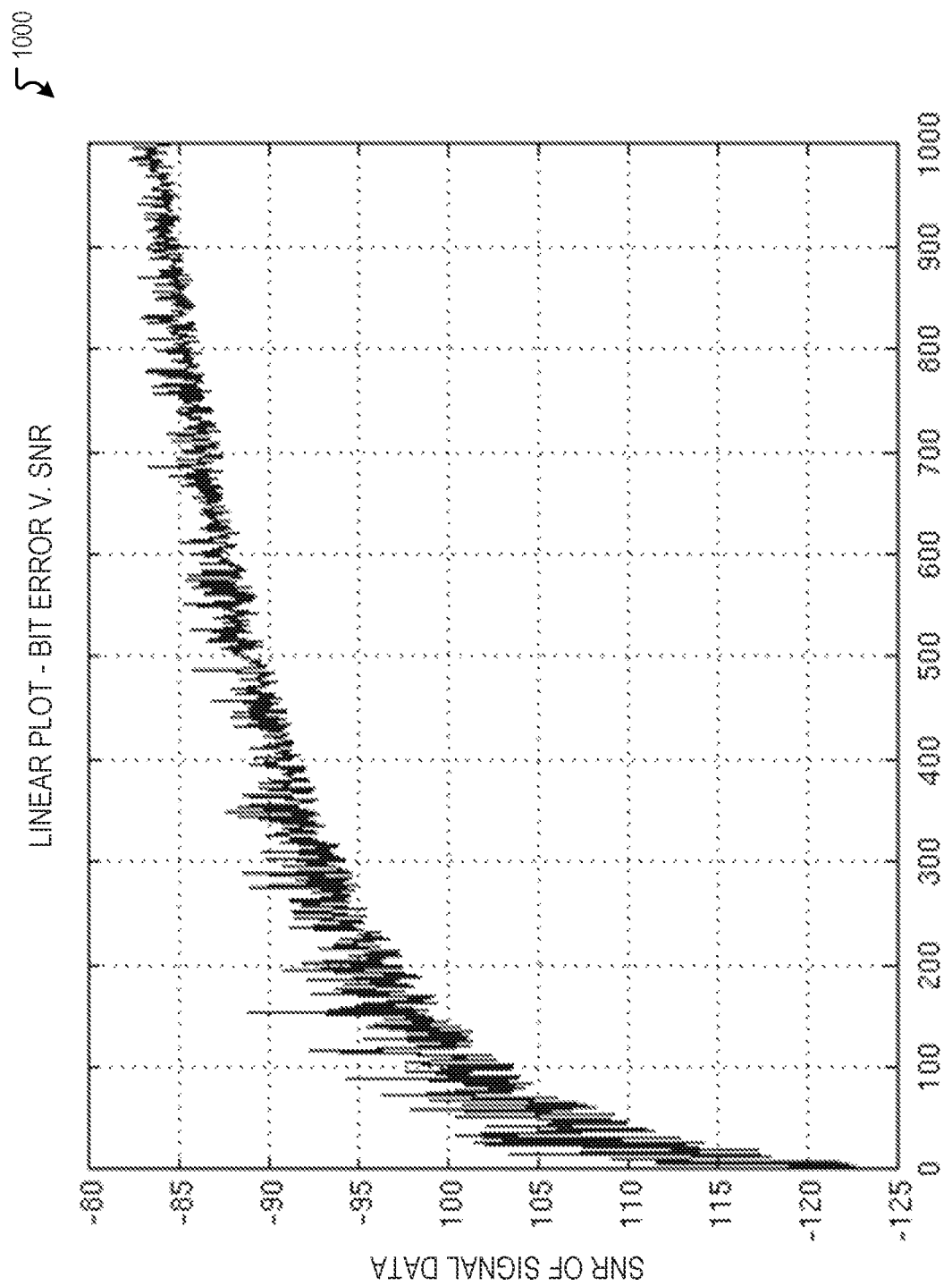
FIG. 10 is a plot showing bit errors versus signal to noise ratio for a single burst using the example isolated ADC circuit of FIG. 4, on a linear scale.
Figure 11:
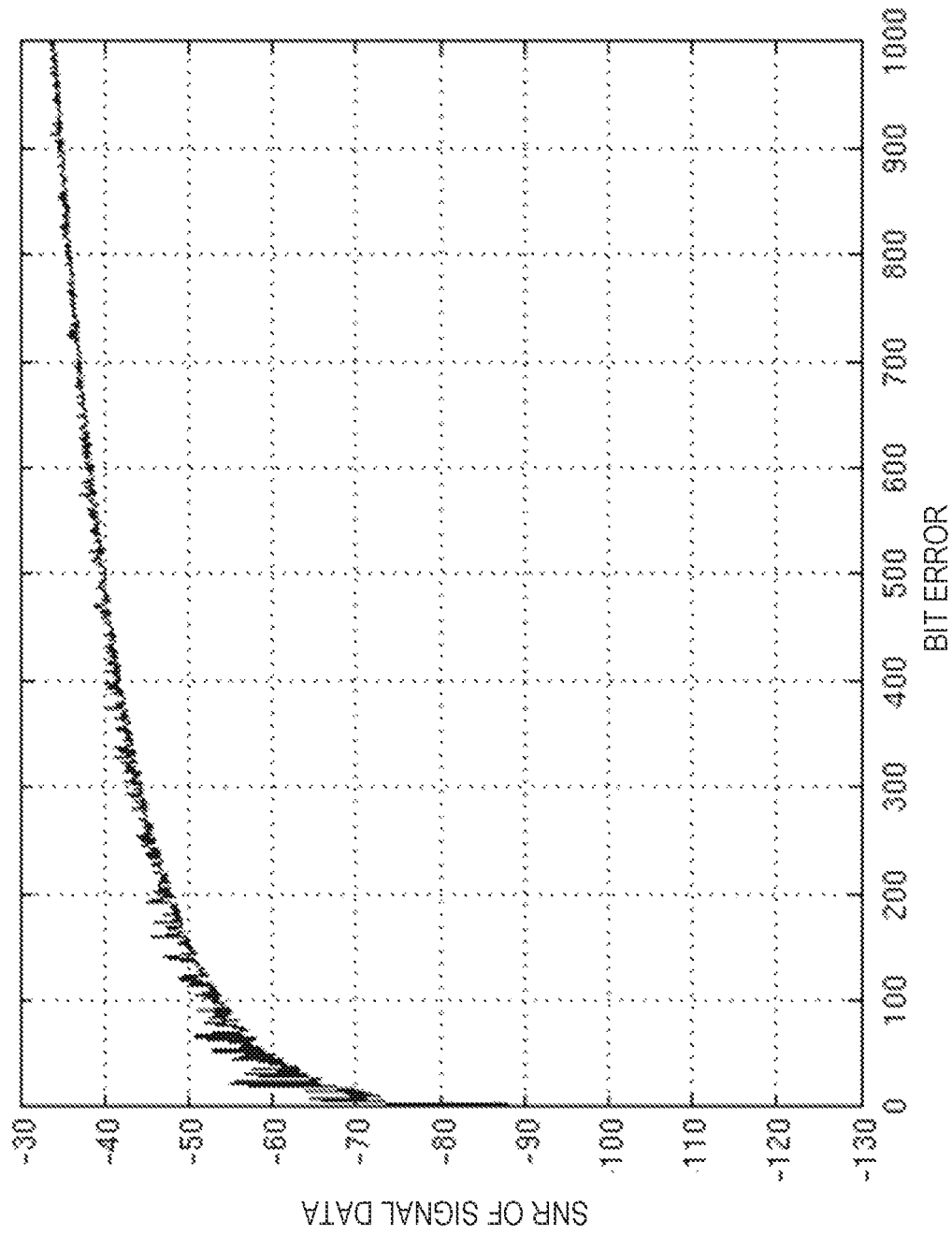
FIG. 11 is a plot showing bit errors versus signal to noise ratio for a dual burst using the example isolated ADC circuit of FIG. 4, on a linear scale.

The example isolated ADC circuit of FIG. 4 was analyzed for interference, which can cause glitches in digital data line or clock. Glitches may result in burst)/interference errors. The analysis was performed by varying the burst size from 1 to 1000. FIG. 9 is a plot 900 showing bit errors versus signal to noise ratio for a single burst, with bit errors indicated on a logarithmic scale. FIG. 10 is a plot 1000 showing bit errors versus signal to noise ratio for a single burst on a linear scale. FIG. 11 is a plot 1100 showing bit errors versus signal to noise ratio for a dual burst on a linear scale. The plots 900, 1000, 1100 were generated by simulating the isolated ADC circuit 400 of FIG. 4 utilizing Matlab by MathWorks, Inc. The plots of FIGS. 9, 10, and 11 indicate that SNR performance of the digital modulator may stay better than 100 dB for a 15 ms test of 5 kHz bursts, or about 90 burst events. In the case of dual burst errors, the SNR degradation happened quickly. However, the frequency component of the line signal had little to no amplitude or frequency degradation, where degradation is shown by a decrease in signal to noise ratio.

Figure 12:
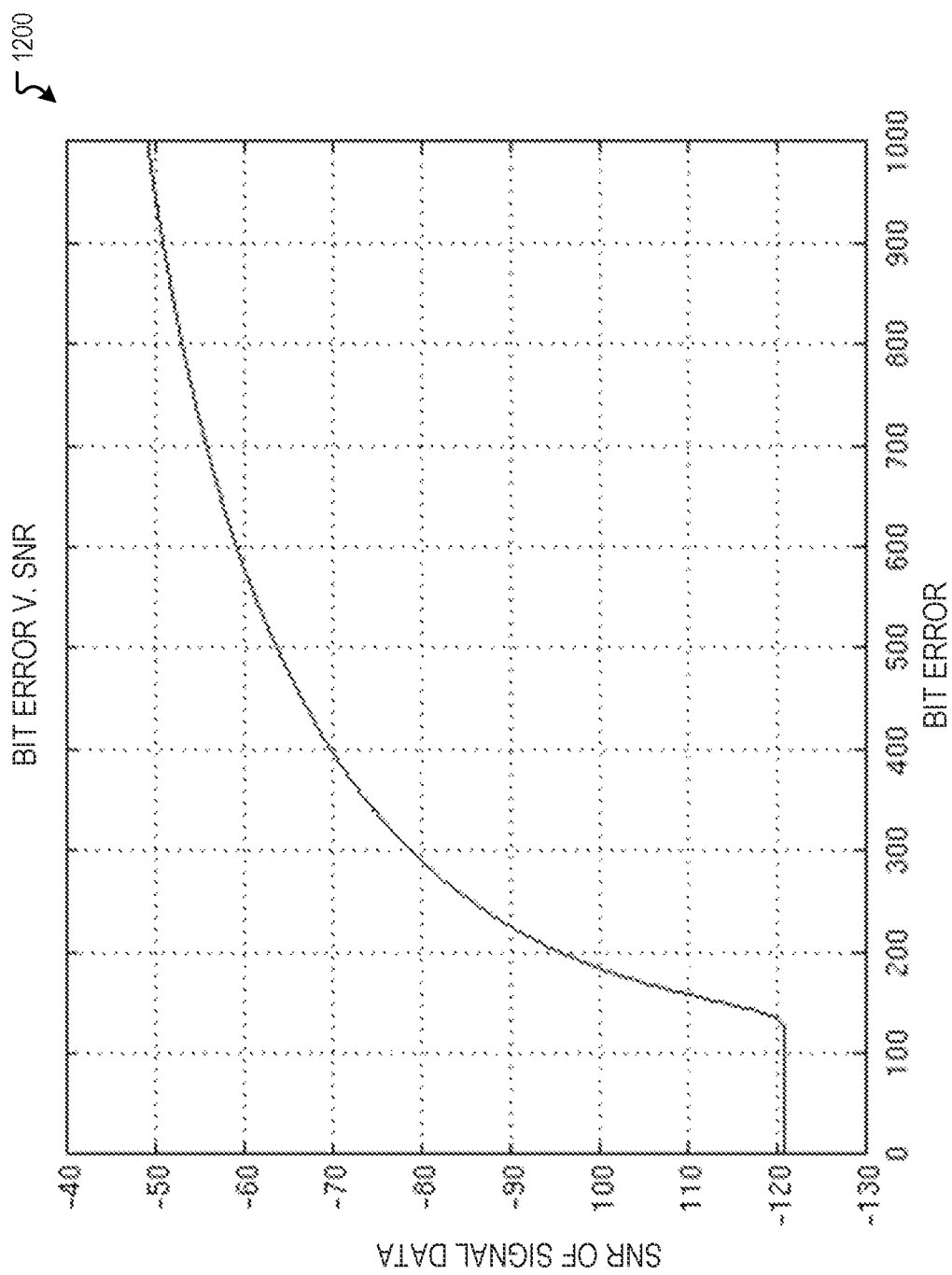
FIG. 12 is a plot showing bit errors versus signal SNR for a single bit flip error.
Figure 13:
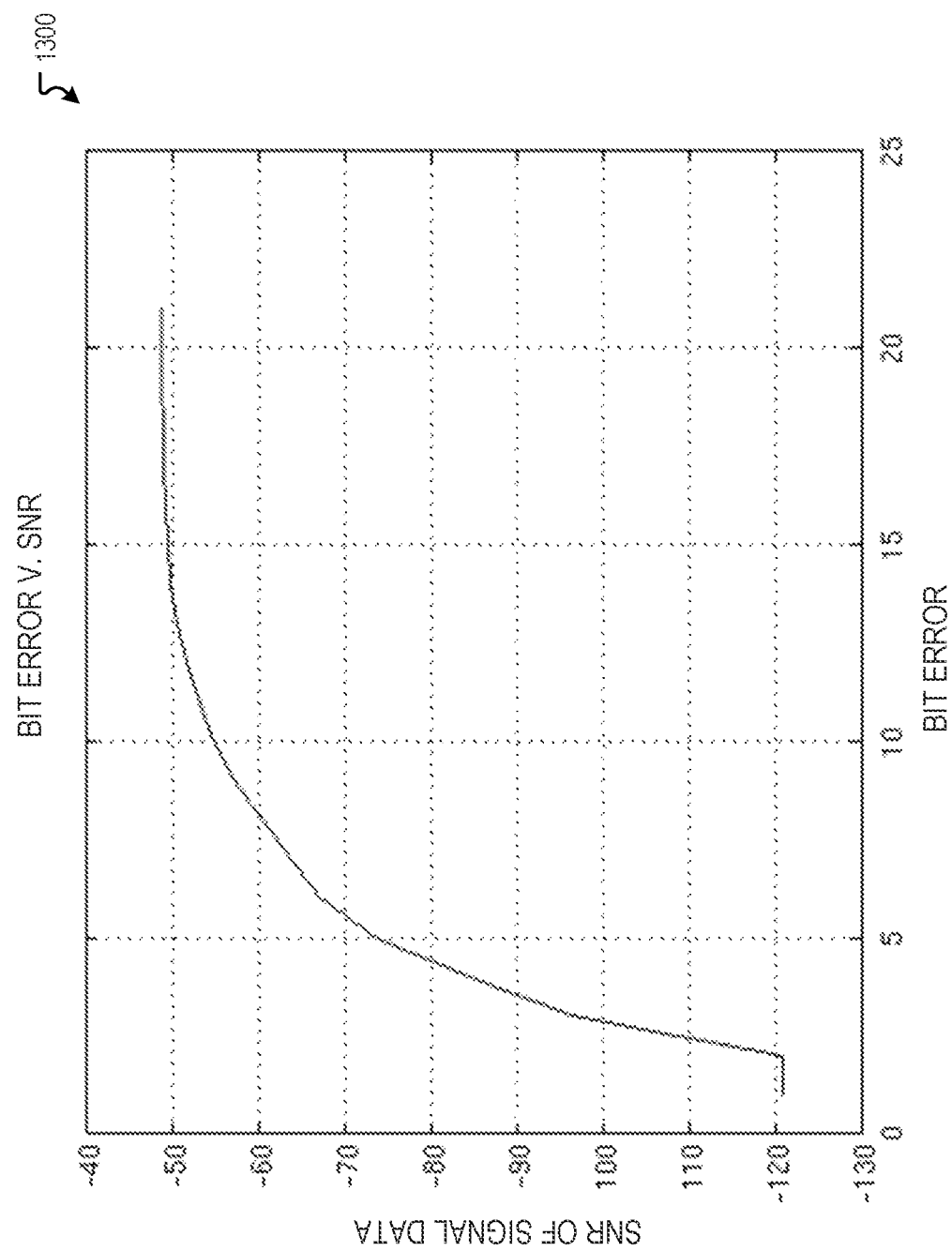
FIG. 13 is a plot showing bit errors versus signal SNR for two bit flip errors.

Errors may also be due to corruption (e.g., from a bit being flipped). The example isolated ADC circuit of FIG. 4 was analyzed for flipping of bits from 1 to 1000. FIG. 12 is a plot 1200 showing bit errors versus signal SNR for a single bit flip error. FIG. 13 is a plot 1300 showing bit errors versus signal SNR for two bit flip errors. The plots 1200 and 1300 were also generated utilizing a simulation in Matlab, by MathWorks, Inc., of the isolated ADC circuit 400 of FIG. 4.

In the analysis, the interval of flip was kept at 1000 (e.g., one bit was flipped at the given interval of 1000). This implies 1 kHz corruption on a 1 MHz DDR stream. It is interesting to note that in the case of data errors this analysis shows almost no variance to the SNR degradation and more bit errors provide a constant degradation. The analyzed example may be tolerable to about 120 bit error, after which the degradation seems rapid until about 300 bit errors. Following that degradation appears to be constant. It is interesting to note the fundamental frequency component is never lost and can easily be recovered by the CIC/SING filter. The system is robust in that the line frequency component has no amplitude and frequency degradation or error and bit errors contribute to higher noise floors.

Figure 14:
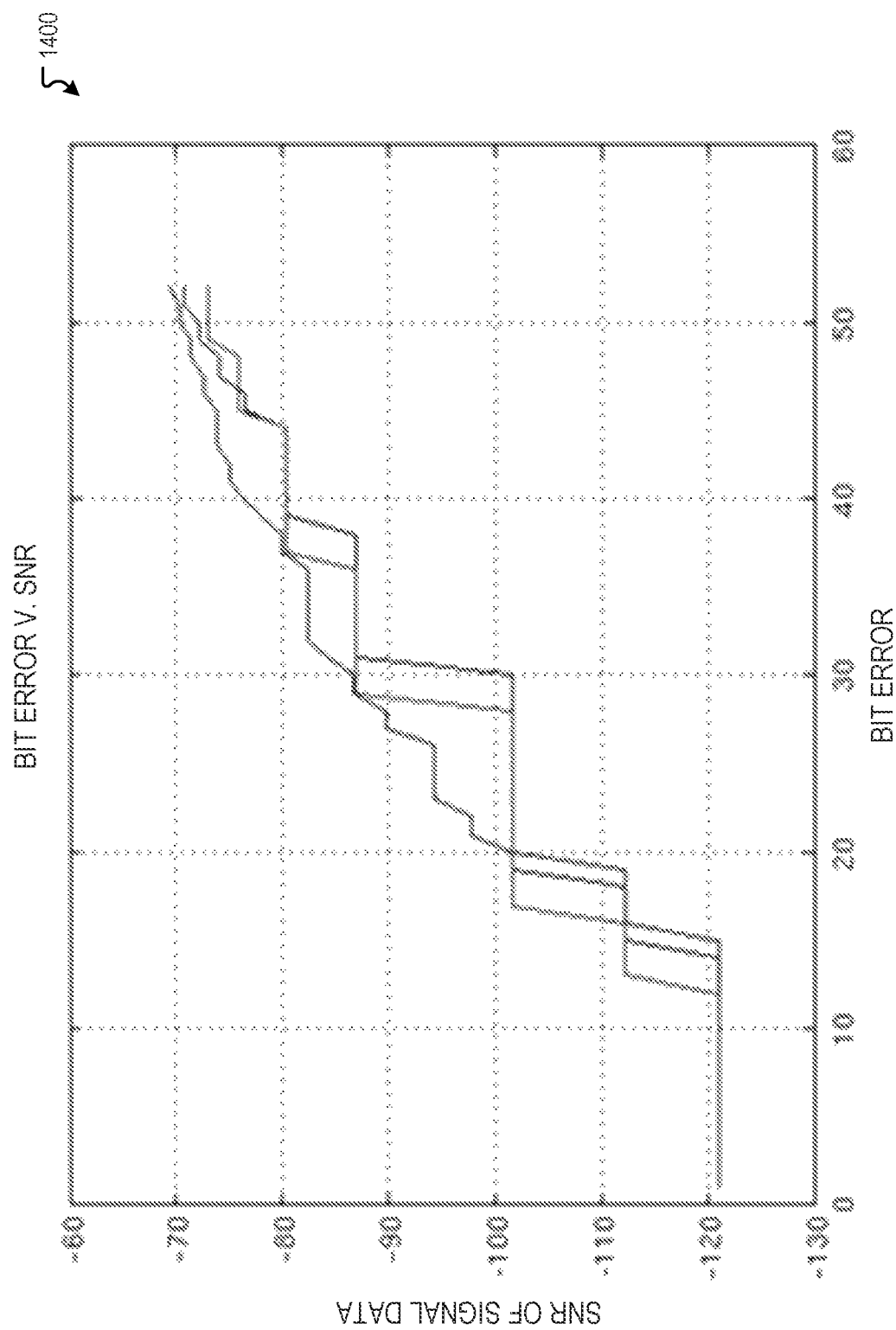
FIG. 14 is a chart 1400 showing plots of bit errors versus SNR for bit errors.
Figure 15:
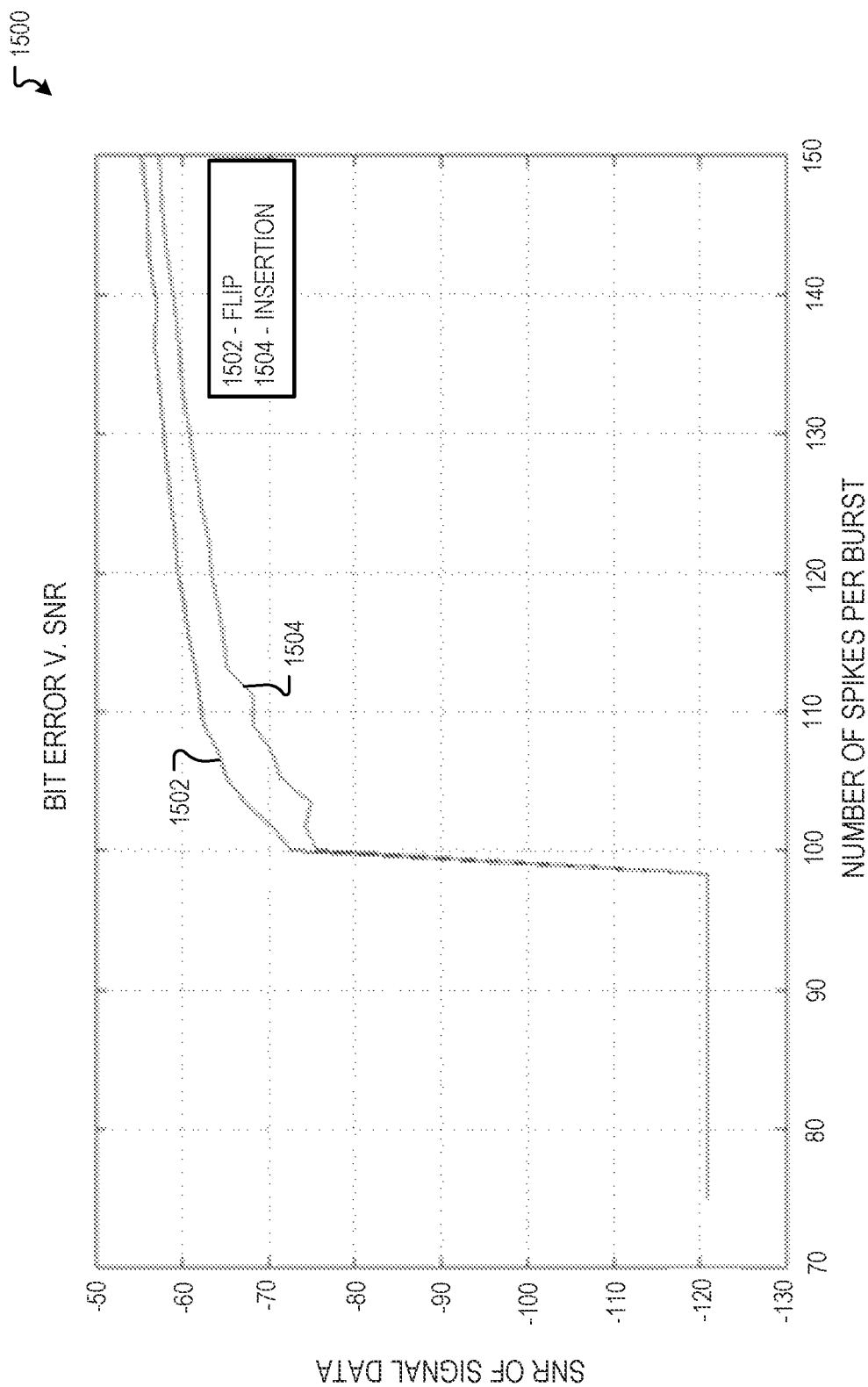
FIG. 15 is a plot showing flip and insertion corruptions.

Corruption or bit flip errors may occur with varying repeatability. The example isolated ADC circuit of FIG. 4 was also analyzed for flip errors with repeatability set to different bit intervals. FIG. 14 is a chart 1400 showing plots of bit errors versus SNR for bit errors with repeatability set to 10,000; 20,000; and 40,000 bit intervals. In all analyzed cases there was no frequency deviation or amplitude deviation. Noise Distortion was observed to go down as the interval of the flip error increase. The plot 1400 also shows results of a simulation of the isolated ADC circuit 400 of FIG. 4 made utilizing Matlab, by MathWorks, Inc. As illustrated in FIG. 4, the example isolated ADC circuit of FIG. 4 was analyzed for flip, insertion, and lost bit errors. FIG. 15 is a plot 1500 showing flip and insertion corruptions at 75 spikes per burst up to 150 spikes per burst. A curve 1502 shows flip corruptions and a curve 1504 shows insertion corruptions. For example, the 61000 EFT specification indicates that analysis should be done for 75 spikes per burst. The plot 1500 also shows results of a simulation of the isolated ADC circuit 400 of FIG. 4 utilizing Matlab by MathWorks, Inc.

Figure 16:
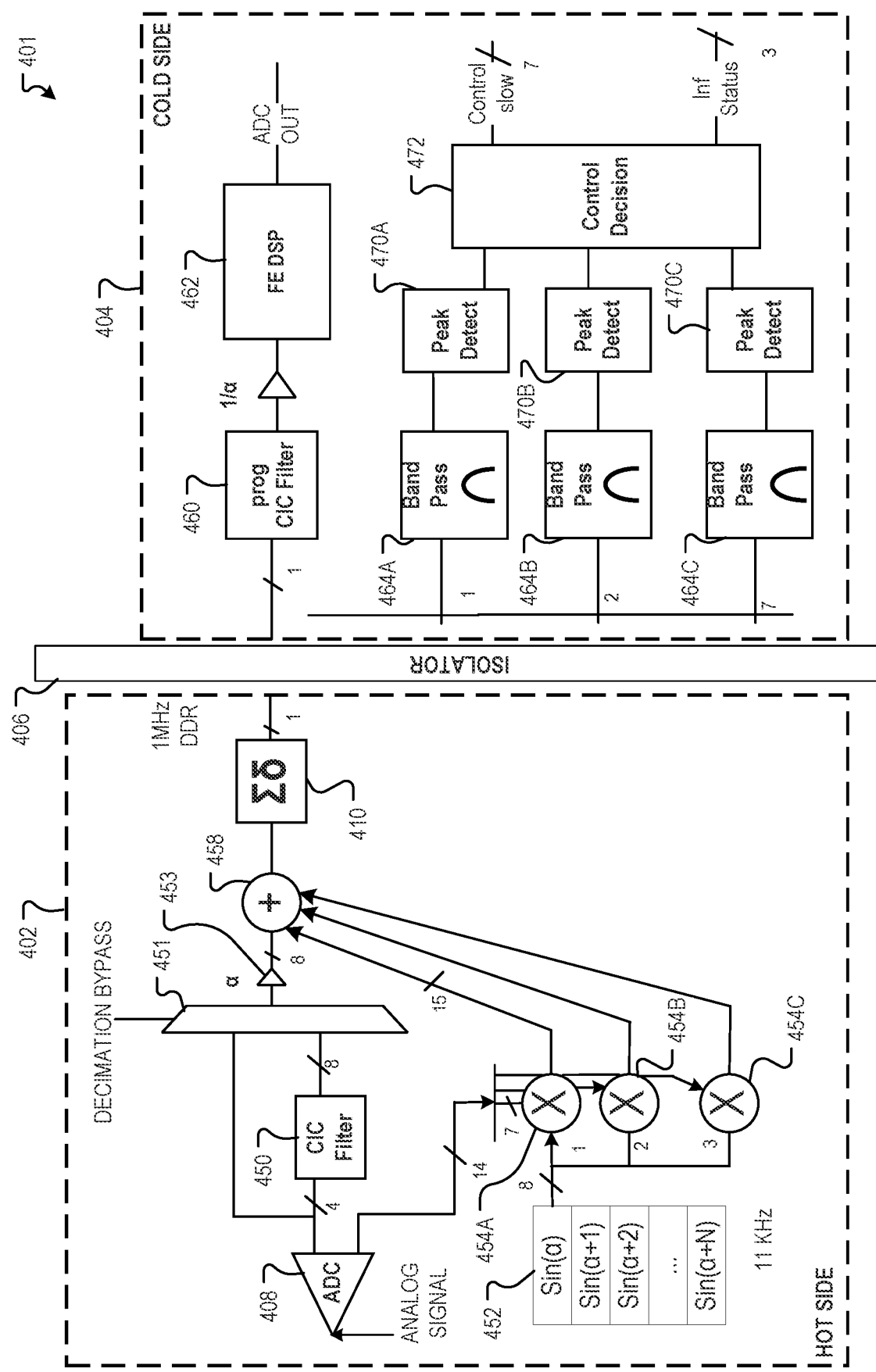
FIG. 16 is a diagram showing another example of an isolated ADC circuit.

FIG. 16 is a diagram showing another example of an isolated ADC circuit 401. The isolated ADC circuit 401 may be similar to the isolated ADC circuit 400 of FIG. 4. The isolated ADC circuit 401 utilizes multiple carriers to send redundant digital data signals. This may combat narrowband interference, for example, at the isolator. In the isolated ADC circuit 401, the digital data signal is modulated onto three different carrier signals at three different carrier frequencies. The three carrier frequencies may be at integer multiples of the bandwidth, in this example, 11 kHz. Three modulators 454A, 454B, 454C modulate the digital data signal onto the three respective carrier frequencies to generate three respective modulated digital data signals, which are additively embedded to the ADC output at adder 458 as described herein.

In the case of EFT events, there may be narrow band corruption at a single carrier frequency. Sending identical digital data over multiple carriers is redundant. This redundancy may be exploited in the receiving control decision circuitry. For example, the single-bit stream at the cold side 404 may be provided to three band pass filters 464A, 464B, 464C having a pass band of about the signal bandwidth and centered at the respective carrier frequencies. Peak detection circuits 470A, 470B, 470C extract the digital signal from the respective carrier signals and provide outputs to a control decision circuit 472. The control decision circuit 472 may take peak signals from the three different peak detectors 470A, 470B, 470C and perform a decision, for example, based on two out of the three paths conforming to codes in bounded regions. In the case of narrowband interference, the isolated ADC circuit 401 may allow for corruption in a 3 kHz bandwidth centered on any one of the three carriers. One of the tradeoffs of this scheme is reduced dynamic range for the digital data signal bits. Assuming we start with an information budget for the ADC output and the digital data signal, it may not be advantageous to trade off dynamic range of the ADC output for robust embedded digital data. Instead, in some examples, it may be better to reduce the dynamic range for control and spread it over three carriers for robustness during narrow band interference. If a scheme is so desired where ADC output range is traded for excess embedded digital data signal robustness by putting the control on multiple carrier the isolated ADC circuit 401 of FIG. 16.

In some examples, clocking on the hot side 402 may include various clocks derived from a base clock, which may be at 1 MHz. In some examples, the progressive CIC filter 460 operates off a 500 kHz clock. On the cold side 404, the decimation of the signal path may continue with further SINC decimation (e.g., up to 64 kHz) followed by optional Biquad decimation (e.g., up to 8 kHz). In some examples, these functions are performed by the frontend. DSP 462. TABLE 1 below shows example clock rates for different components of the arrangements described herein.

TABLE 1

| Hot Die ADC r | Hot Die Sinc | Hot Die SDM (CIFF) | Cold Die Sinc | FE DSP (Signal) |
|---|---|---|---|---|
| 2 MHz | 500 kHz | 1 MHz (DDR) | %8 (62.5 kHz) | 4/8 MHz |
| 1 MHz | 250 kHz | 500 kHz (DDR) | %4 (62.5 kHz) | 4/8 MHz |
| 500 kHz | 125 kHz | 250 kHz (DDR) | %2 (62.5 kHz) | 4/8 MHz |

In some examples, the digital data signal is embedded with multiples on a single carrier, for example, as shown and described with respect to FIGS. 3 and 4 above. In these examples, peak detection is used after band pass filtering to demodulate the digital data signal from the carrier signal. In these examples, the bandpass filter may recover the modulated data signal quickly, but the peak detector may be slower to converge, increasing the latency of the embedded digital data.

Figure 17:
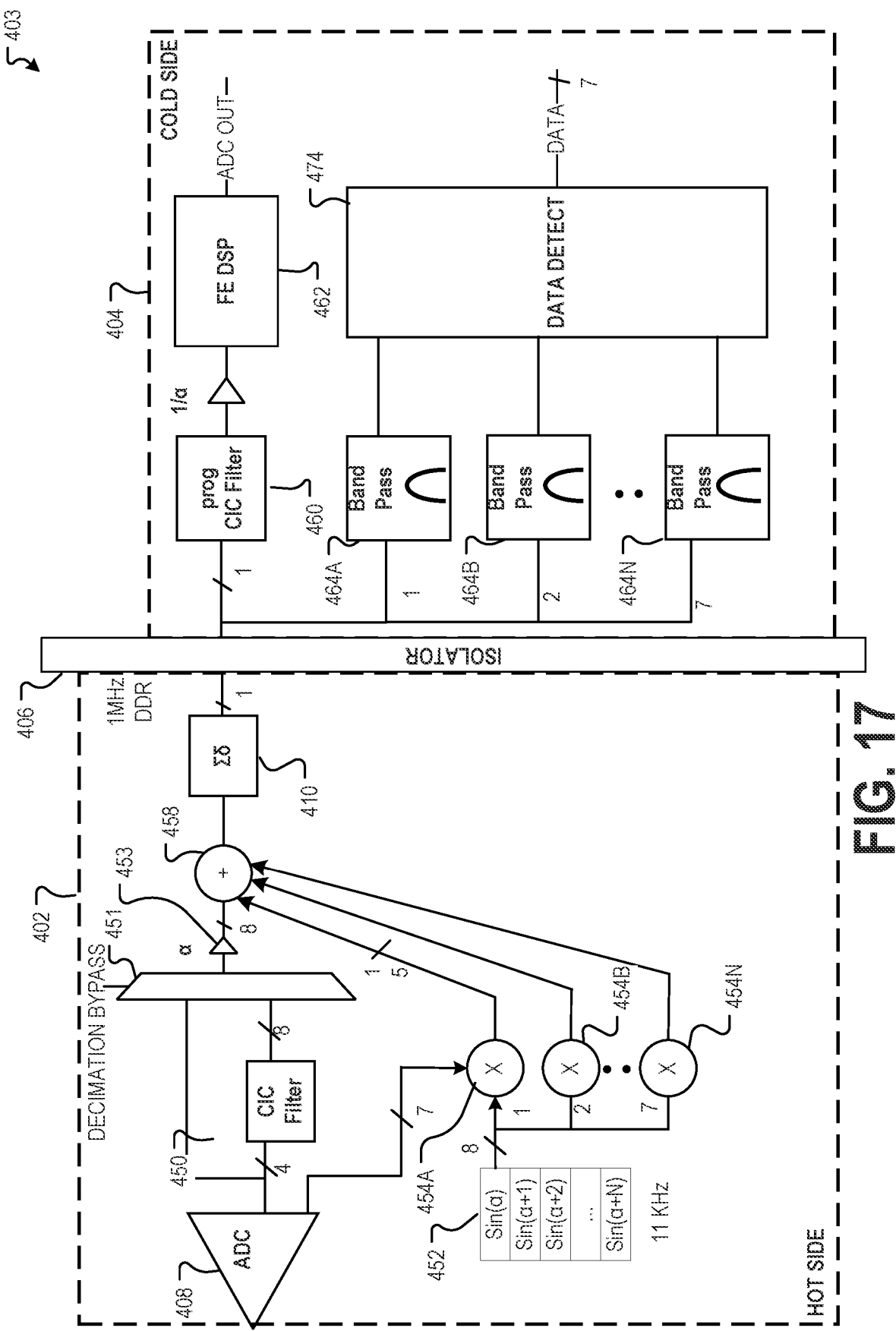
FIG. 17 is a diagram showing another example of an isolated ADC circuit implementing a fast path recovery scheme.

In other examples, a different carrier may be used for each bit to implement a fast path recovery process. FIG. 17 is a diagram showing another example of an isolated ADC circuit 403 implementing a fast path recovery scheme. In the example of FIG. 7, the digital data signal has a 7-bit word length. Seven modulators 454A, 454B, 454N are used to modulate each bit of the word onto a distinct carrier signal. This generates seven modulated data signals that are additively embedded to the ADC output at adder 458. The carrier frequencies of the carrier signals may be integer multiples of the bandwidth, in this example, 11 kHz. In the example of FIG. 17, the digital data signal is put on 11 kHz and six harmonics thereof.

On the cold side 404, a distinct bandpass filter 464A, 464B, 464N is provided for each of the modulated data signals. Because only a single bit is modulated on each modulated data signal, the individual bits of the digital data signal words can be recovered at a data detection circuit 474. The data detection circuit 474 may detect the individual bits modulated onto the respective carrier frequencies utilizing a binary detect algorithm. Accordingly, the digital data signal can be reconstructed quickly without the need to wait for a peak detection circuit to converge. For example, the data detection circuit 474 may include a digital filter that provides a moving average of the bit rate. On the other hand, a peak detector may need to recover a wide word value and average over time. The digital data signal recovery of the arrangement of FIG. 16 may be robust, although the tradeoff is higher digital area for the additional modulators and band pass filters.

Figure 18:
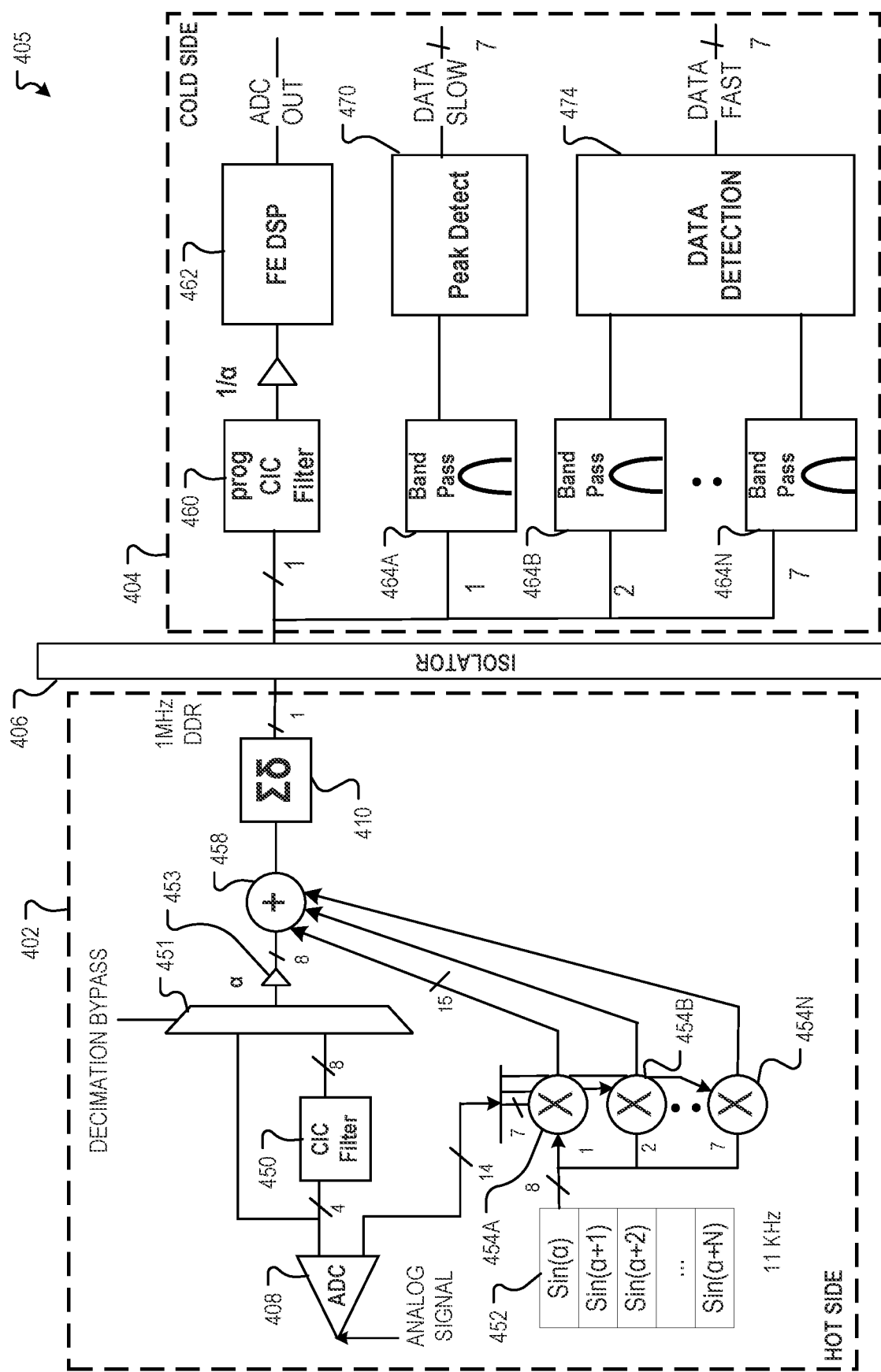
FIG. 18 is a diagram showing another example isolated ADC circuit implementing a fast path recovery scheme and a slow path recovery scheme.

FIG. 18 is a diagram showing another example isolated ADC circuit 405 implementing a fast path recovery scheme and a slow path recovery scheme. At the hot side 402, the digital data signal has a 14-bit word length. Words of the digital data signal are split. A 7-bit nibble is modulated onto a first carrier signal at modulator 454A. The additional bits of each word are individually modulated onto additional carrier signals at additional modulators 454B, 454N (e.g., one bit per carrier signal). The result may be a 15-bit modulated data signal resulting from the modulator 454A and 9-bit modulated data signals resulting from the other modulators 454B, 454N. (The nine bits including one bit from the digital data signal and the 8-bits from the carrier.) The carrier frequencies of the carrier signals may be integer multiples of the bandwidth, in this example, 11 kHz. In the example of FIG. 18, the digital data signal is at 11 kHz and six harmonics thereof. Also, the word length of the digital data signal may vary as well as the combinations of nibbles and bits modulated onto individual signals.

On the cold side 404, each modulated data signal may have a corresponding band pass filter 464A, 464B, 464N. A peak detection circuit 470 demodulates the multiple bits modulated onto the first carrier signal. The remaining bits are decoded by a data detection circuit 474. The binary detection circuit 474 may decode bits by making a binary decision if the band pass filtered signal has sufficient signal strength. In this example, the peak detection circuit 470 may converge more slowly than the data detection circuit 474, meaning that the latency for 7-bit nibble modulated onto the first carrier signal is higher than the latency of the remaining bits modulated onto distinct carrier signals. For example, the portion of the digital data signal modulated onto the first carrier signal, and detected using the peak detection circuit, may be data, such as status bits, that are expected to vary slowly.

Figure 19:
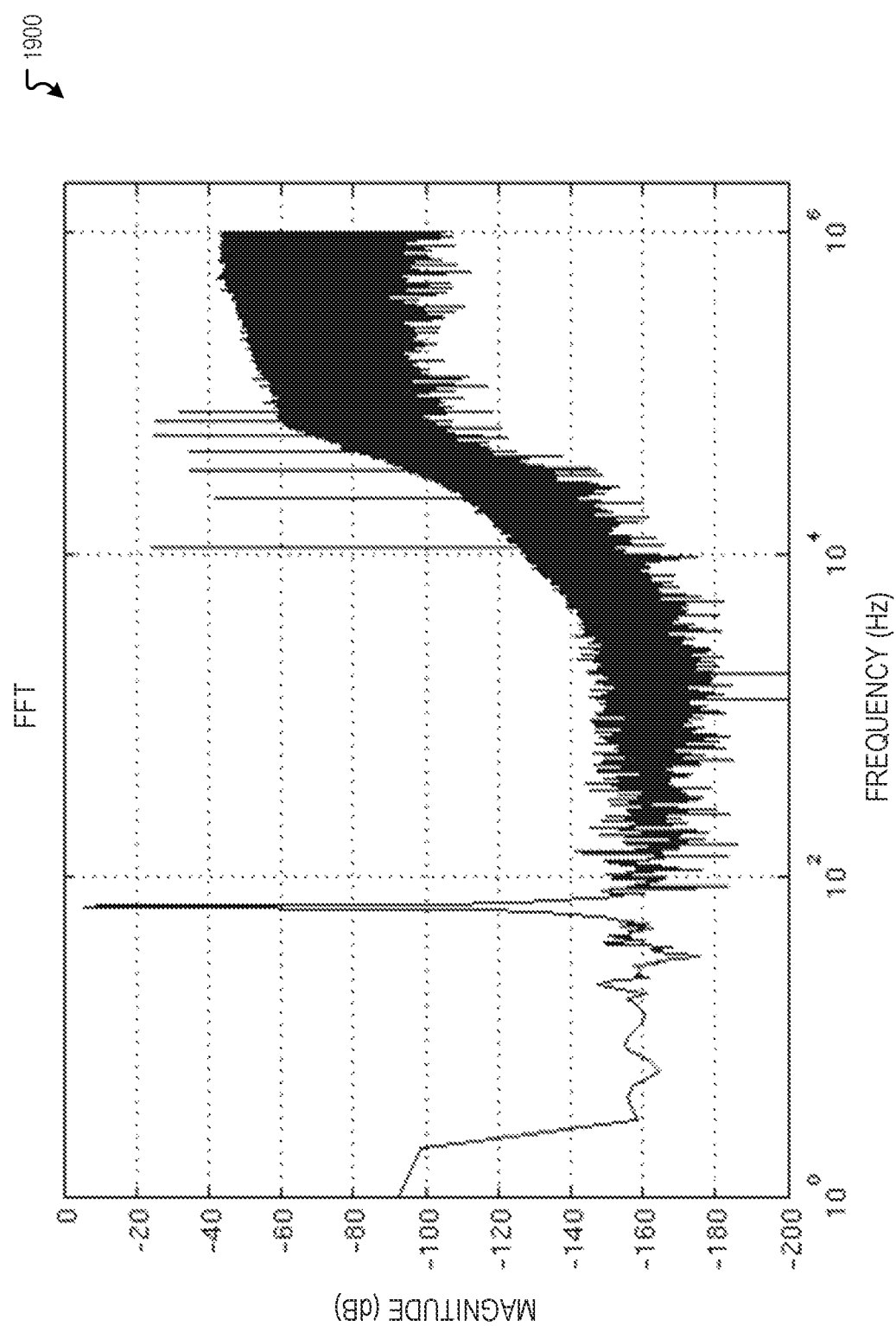
FIGS. 19-21 include respective plots showing fast Fourier transforms (FFTs) of data transmitted in the isolated ADC circuit of FIG. 18 with fast and slow control at lower carrier and fast control at integer multiples of fast carrier over DDR.
Figure 20:
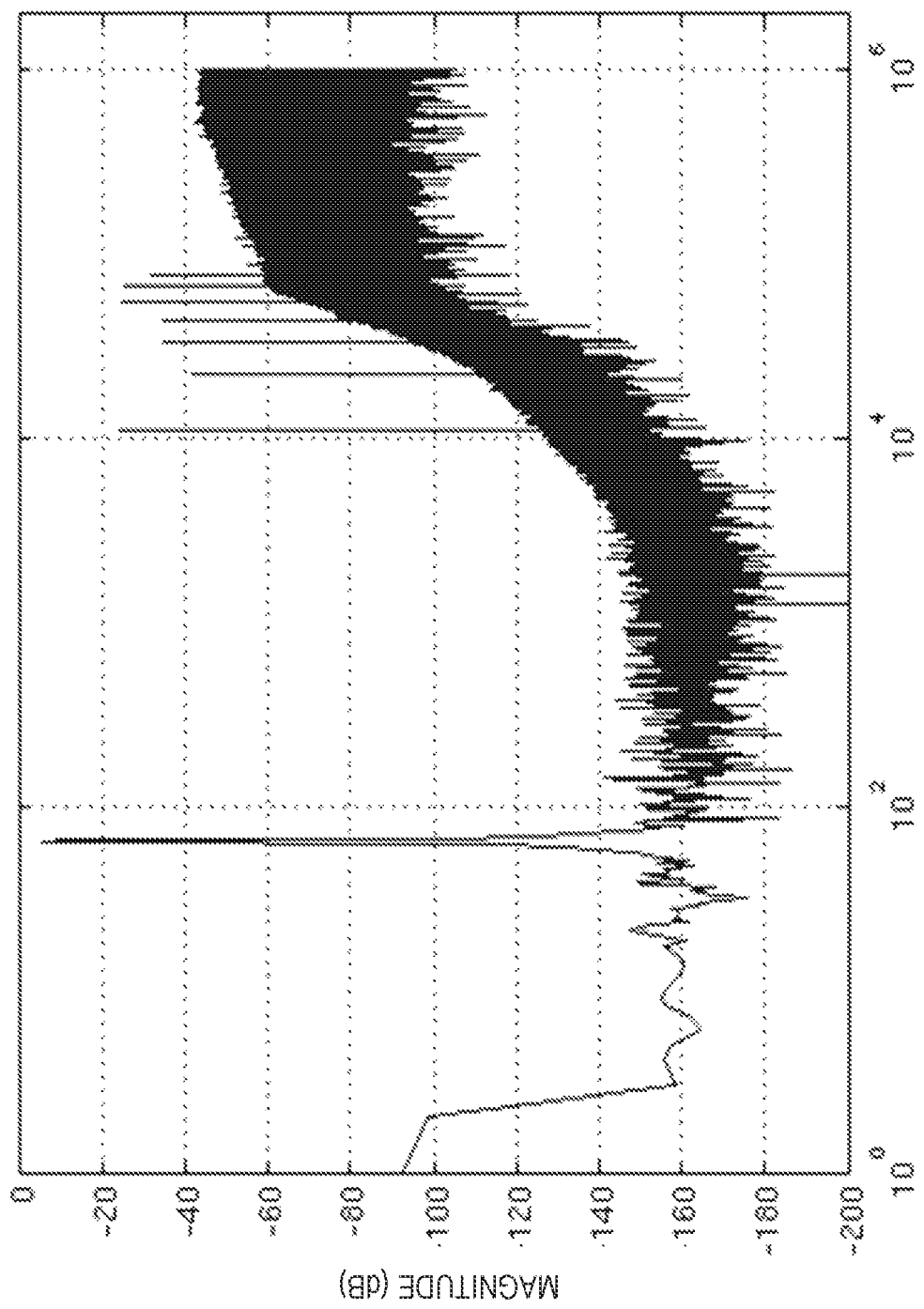
Figure 21:
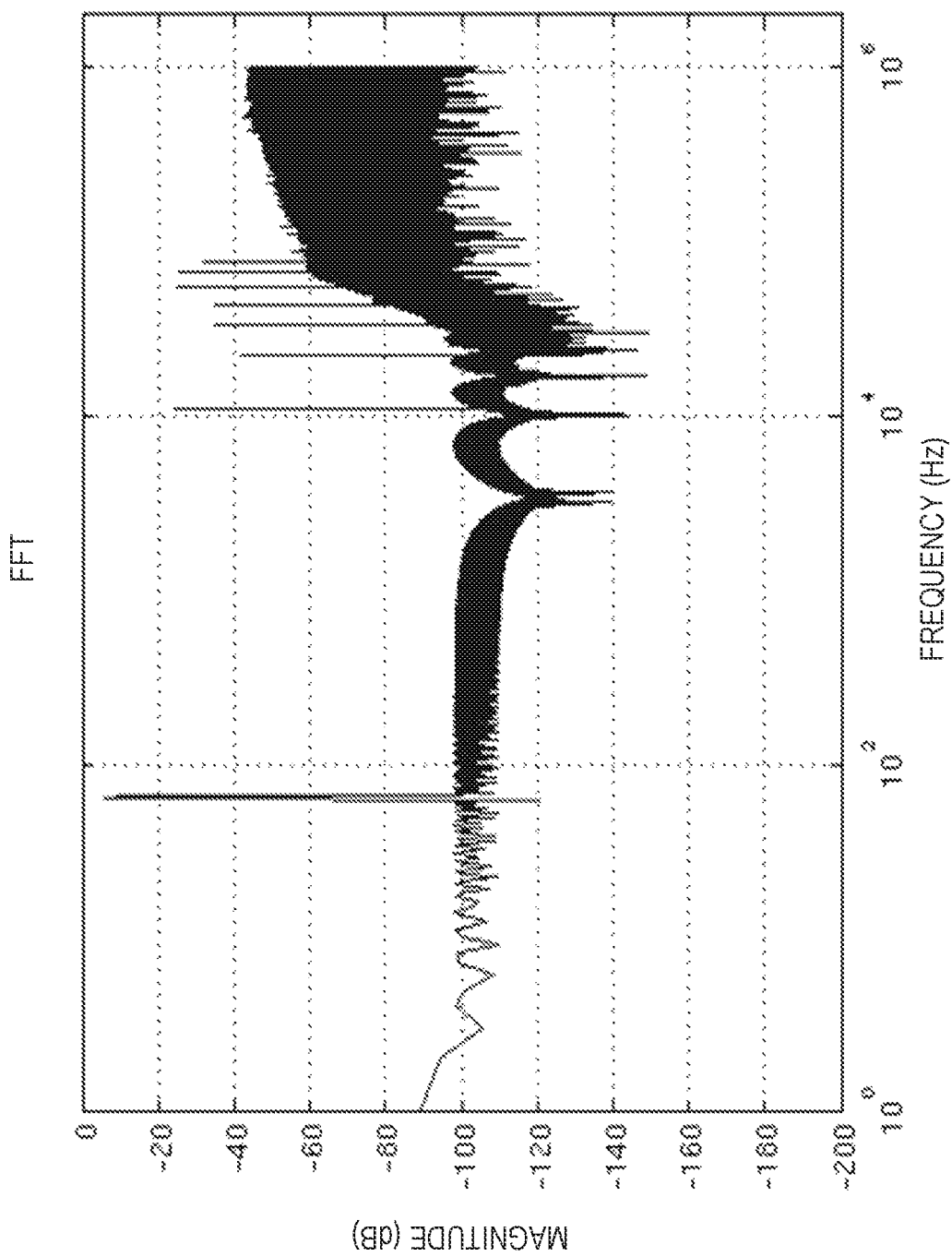

FIGS. 19-21 include respective plots 1900, 2000, 2100 showing fast Fourier transforms (FFTs) of data transmitted in the isolated ADC circuit 405 of FIG. 18 with fast and slow control at lower carrier and fast control at integer multiples of fast carrier over DDR. The plot 1900 of FIG. 19 shows compliance at 75 spikes per burst. The plot 2000 of FIG. 20 shows compliance at 91 spikes per burst. The plot 2100 of FIG. 21 shows compliance at 101 spikes per burst. For example, the noise floor of the system rises as the number of spikes per burst increases.

Figure 22:
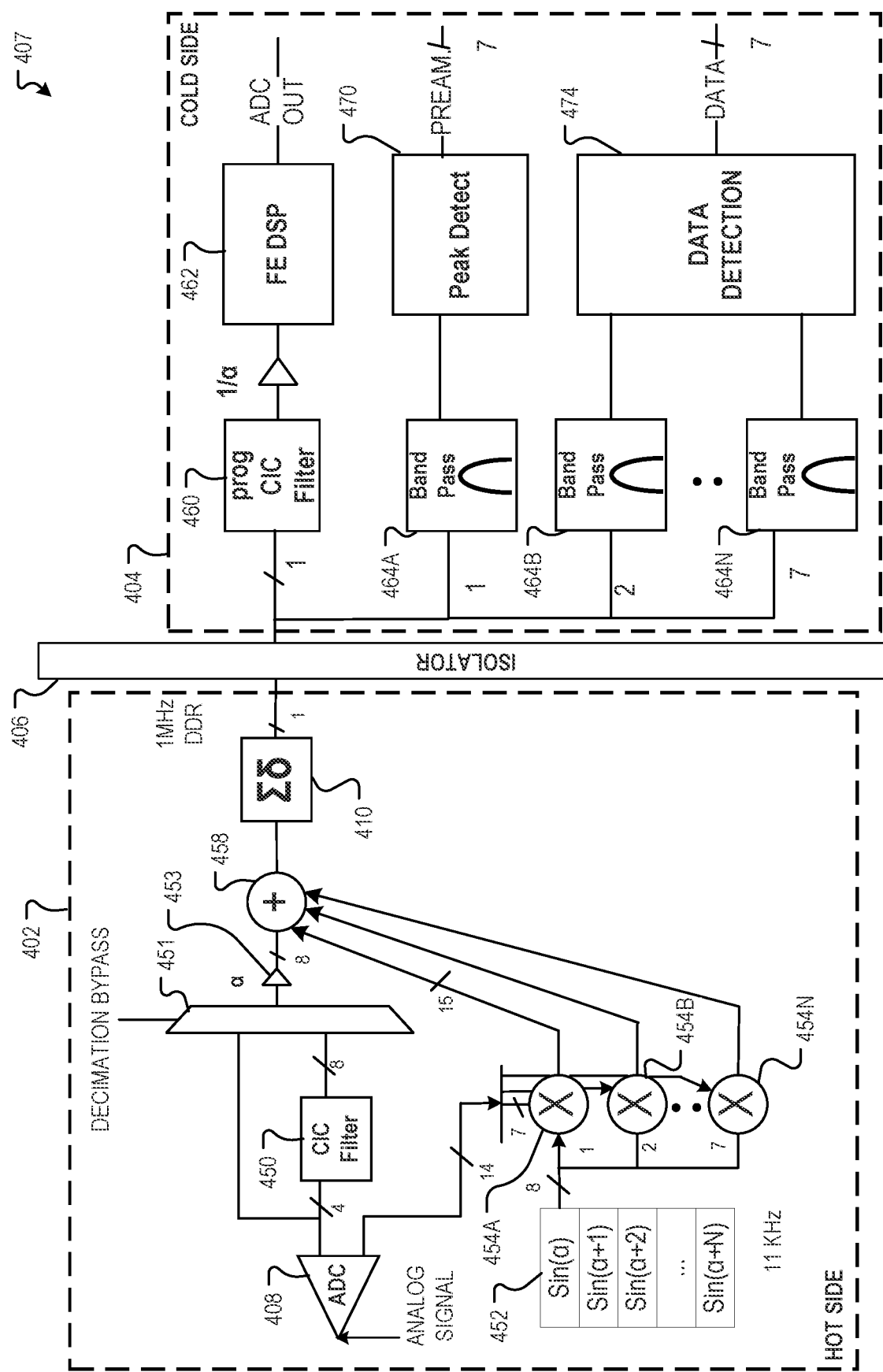
FIG. 22 is a diagram showing another example isolated ADC circuit 407.

FIG. 22 is a diagram showing another example isolated ADC circuit 407. The isolated ADC circuit 407 also partitions the digital data signal on the hot side into fast and slow processing lanes with multiple carrier signals, similar to the isolated ADC circuit 405. The isolated ADC circuit 407 is configured to send the embedded digital data signal in a format including a preamble and packets. For example, in a packet mode configuration, a preamble signifies the start of packet. This preamble is a detect of 1 that is the presence of a carrier. Subsequent tones are part of the digital data that can be packetized. The packet construction can be accomplished by using available dynamic range of the carrier tone and also using the next dynamic range of the next tone. Since the noise power of the modulator rises with frequency the information per carrier will go down as the integer multiple rises. In the case above using six carrier tones a total of 4+3+2+2+2+1=14 bits can be sent. If the recovery is done at 500 kHz with 75 samples of convergence time it implies that 14*500 kHz/75=93 Kbits per second can be sent using this scheme. This method operates at low efficiency of entropy as for an oversampled system of clock frequency 2 MHz with Nyquist frequency being 1 MHz. The usable spectral band above the $180^{th}$ harmonic being 10 kHz to 1 MHz being 990 kHz the amount of control information that can be sent is roughly 93 Kbps/990 Kbps implies an efficient of approximately 9.39%. Higher efficiencies may be achievable by coding of packets using advanced spatial and temporal techniques are employed.

After the signal crosses over the isolation interface it may be input into the CIC filter and in parallel input into the band pass filters 464A, 464B, 464N. The band pass filter 464A, 464B, 464N may be a biquad operating at 500 kHz. Once the signal is filtered through the bandpass filters 464A, 464B, 464N it may be converted to absolute value and input into the peak detector. The peak detector operates at 500 kHz. The input code may be seven bits and can take values from 0 to 127. The biquad filter may keep fraction precision up to 8 bits. The resulting number format may be unsigned U7.8.

Figure 23:
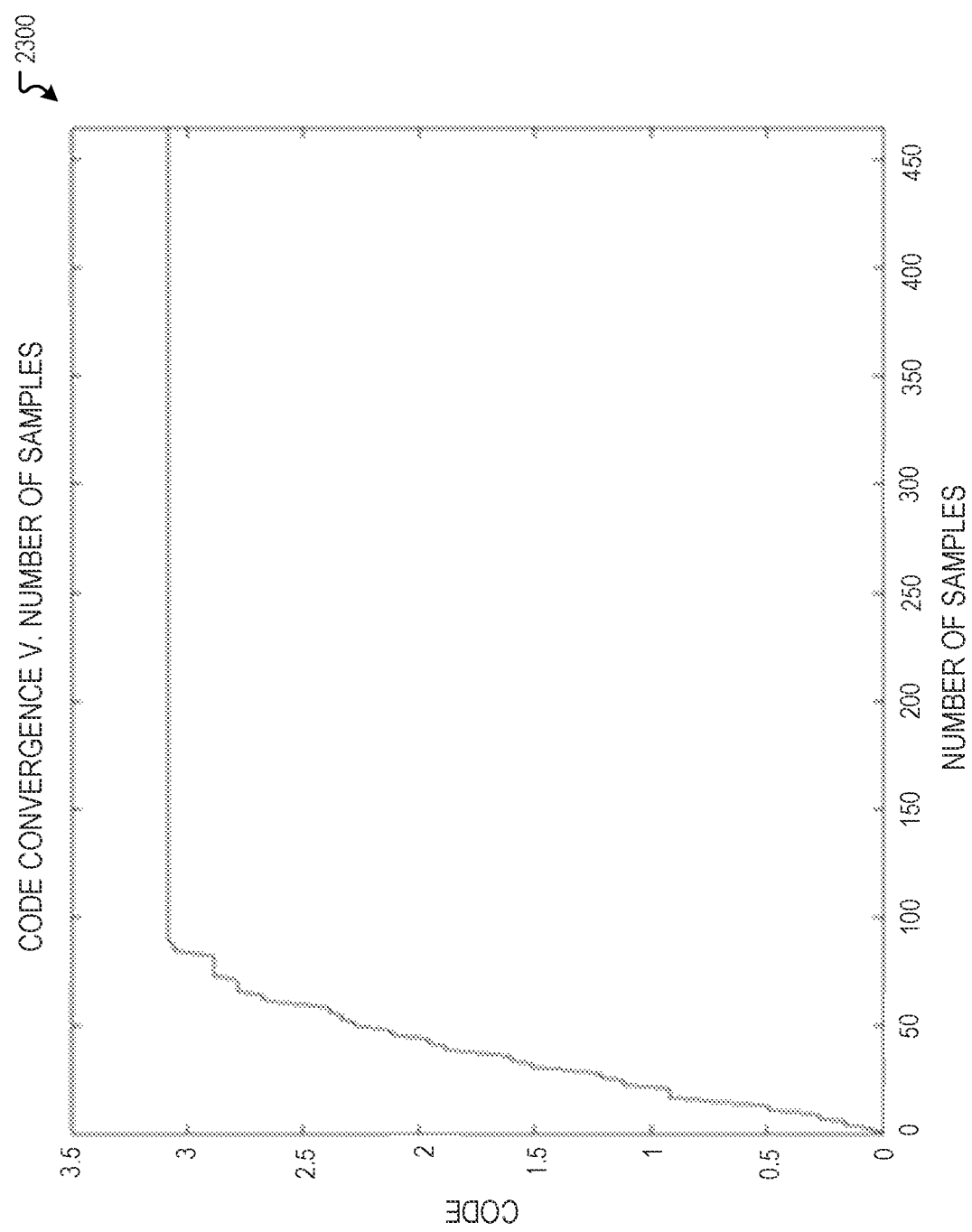
FIG. 23 is a plot showing code convergence versus the number of samples using peak detection, as described herein.

FIG. 23 is a plot 2300 showing code convergence versus the number of samples using peak detection, as described herein. Noise of up to eight fractional bits may be tolerated on the codes. The peak detector is shown to converge at about 75 samples at 500 kHz. It is possible to make the peak detector more aggressive with prediction of the peak before convergence and this has to be explored further. The total delay for the slow path will be the convergence time of the peak detector plus the latency of the band pass filter. In the case of the fast path there is no peak detection necessary for a binary decision.

In some examples, the reliability of the propagation of the embedded digital signal from the hot side to the cold side is significant. Several experiments were done where bursty noise was introduced to bring the performance down from 121 dB to 70 dB by varying the number of spikes per burst. It is noted for the degradation in SNR in the signal fundamental the control code is very reliably decoded provided at least 4 fractional bits are employed. In some examples, this architecture recommends having 8 as the likelihood of a misdetection will be 1 in several million. Analyzing the fractional numbers there appears to be a scaling bias between 0.13 and 0.38. The bias scales from code 127 to code 0 and the distance between codes is approximately 1. Comparing Code 0 and Code 1 it is observed the difference is 0.82547 and this is less than 1 and is due to the inherent noise in the system. If the bias is reduced then the probability of misdetection would rise closer to the end code 127. If the bias is increased the control code 0 when on bits are on could be misdetected to a 1. In the bias selected there is some margin on changing of about + or −15%.

Figure 24:
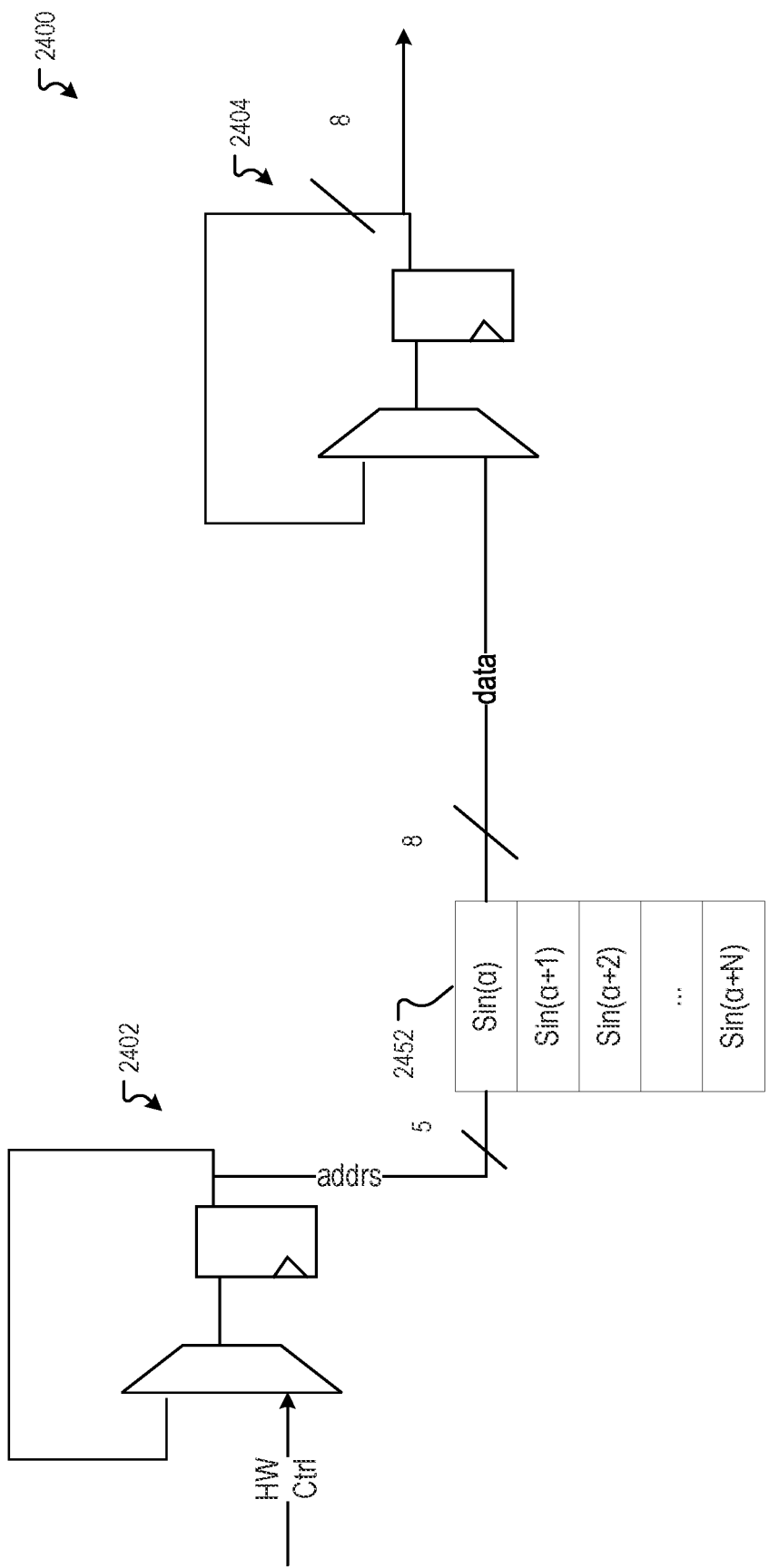
FIG. 24 is a diagram showing one example of a LUT-based sinusoid generator.

FIG. 24 is a diagram showing one example of a LUT-based sinusoid generator 2400. For example, the sinusoid generator 2400 may be used to generate digital carrier signals described for use with the various isolated ADC circuits described herein. The sinusoid generator 2400 comprises a LUT 2452, at LUT address generator 2402, and an output waveform generator 2404. The sinusoid generator 2400 may be operable at 1×, 2×, and 4× rates. The sinusoid generator 2400 may be designed with fixed coefficients using a LUT 2452 approach. The angle may be 2*π*11060/2 MHz. In some examples, the LUT table has 45 points. An odd number of entries may not be ideal, as it makes the optimization using quarter wave a little bit trickier. Using this approach there may be distortion as the LUT 2452 repeats over a period rather than computing next cycle values. The LUT 2452 may be optimized to a width of 10 bits which includes the sign bit. There is minimum error deviance however the guard band 0.825 between codes is further reduced due to both phase error and finite bit width truncation. The scale factor α on the cold side may be changed slightly to compensate for this error. The area can be optimized using only 12 entries rather than 45 using quarter wave symmetry. The multiplier on the hot side is 10×7. TABLE 2 below gives the recovered codes using 10 bit sine wave entries.

TABLE 2

| Control Code | Noise (75 spikes/Burst) | Noise (91 spikes/Burst) | Noise (101 spikes/Burst) | Signal SNR (75, 91, 101) dB |
| --- | --- | --- | --- | --- |
| 0 | 0.396012 | 0.396012 | 0.529947 | 121, 121, 70 |
| 1 | 1.239028 | 1.239028 | 1.411864 | 121, 121, 70 |
| 2 | 2.188763 | 2.188763 | 2.308963 | 121, 121, 69.4 |
| 7 | 7.039496 | 7.039496 | 7.039496 | 121, 121, 70 |
| 8 | 8.051923 | 8.051923 | 8.051923 | 121, 121, 70 |
| 30 | 30.014003 | 30.014003 | 30.014003 | 121, 121, 69.4 |
| 31 | 31.087510 | 31.087510 | 31.087510 | 121, 121, 70 |
| 63 | 63.019798 | 63.019798 | 63.019798 | 102, 102, 70 |

TABLE 2 shows that a control code of the digital data signal is recovered less accurately as the number of spikes per burst increases and as the code itself is lower.

Example 1 is an isolated analog-to-digital converter (ADC) circuit, comprising: a first ADC positioned on a first side of the isolated ADC circuit, the first ADC configured to convert a first analog input signal to a first side multi-bit digital signal, wherein the first side is separated from a second side of the isolated ADC circuit by a first isolator; a digital modulator on the first side, the digital modulator configured to convert the first side multi-bit digital signal to a first single-bit stream; and a first filter positioned on the second side, the first filter configured to receive the first single-bit stream across the first isolator and to generate a first reconstructed multi-bit digital signal using the first single-bit stream.

In Example 2, the subject matter of Example 1 optionally includes a first die comprising the first ADC and the digital modulator; and a second die comprising the first filter, wherein the first isolator provides a signal path between the first die and the second die.

In Example 3, the subject matter of Example 2 optionally includes wherein the first die and the second die are part of a first package.

In Example 4, the subject matter of any one or more of Examples 2-3 optionally includes a third die separated from the second die by a second isolator, the third die comprising: a second ADC configured to generate a second multi-bit digital signal using a second analog input signal; and a second digital modulator configured to generate a second single-bit stream using the second multi-bit digital signal, and wherein the second die further comprises a second filter configured to receive the second single-bit stream across the second isolator and to generate a second reconstructed multi-bit signal using the second single-bit stream.

In Example 5, the subject matter of any one or more of Examples 1-4 optionally includes a decimator electrically coupled between the first ADC and the digital modulator to generate a decimated multi-bit signal.

In Example 6, the subject matter of Example 5 optionally includes a multiplexer electrically coupled to receive the first side multi-bit digital signal, the decimated multi-bit signal, and a multiplexer input, wherein an output of the multiplexer provides the first side multi-bit digital signal when the multiplexer input is provided a first value and provides the decimated multi-bit signal when the multiplexer input is provided a second value.

In Example 7, the subject matter of any one or more of Examples 1-6 optionally includes a first modulator configured to generate a first modulated data signal based at least in part on a digital data signal and a digital carrier signal at a first carrier frequency, wherein the first carrier frequency is greater than a frequency of the first single-bit stream; and an adder configured to add the first modulated data signal to the first single-bit stream.

In Example 8, the subject matter of Example 7 optionally includes a second modulator configured to generate a second modulated data signal based at least in part on the digital data signal and a second digital carrier signal at a second carrier frequency, wherein the second carrier frequency is greater than the first carrier frequency, wherein the second carrier frequency is greater than the frequency of the first single-bit stream, and wherein the adder is also configured to add the second modulated data signal to the first single-bit stream; and a first band pass filter positioned on the second side, the first band pass filter configured generate a first filtered signal around the first carrier frequency; a first peak detector configured to generate a first peak signal based at least in part on the first filtered signal; a second band pass filter positioned on the second side, the second band pass filter configured to generate a second filtered signal around the second carrier frequency; a second peak detector configured to generate a second peak signal based at least in part on the second filtered signal; and a data detection circuit configured to select a reconstructed data signal based at least in part on the first peak signal and the second peak signal.

In Example 9, the subject matter of any one or more of Examples 1-8 optionally includes a first modulator configured to generate a first modulated data signal based at least in part on a first bit of a digital data signal and a first digital carrier signal at a first carrier frequency, wherein the first carrier frequency is greater than a frequency of the first single-bit stream; a second modulator configured to generate a second modulated data signal based at least in part on a second bit of the digital data signal and a second digital carrier signal at a second carrier frequency greater than the first carrier frequency; and an adder configured to add the first modulated data signal and the second modulated data signal to the first single-bit stream.

Example 10 is an analog-to-digital conversion method for an isolated analog-to-digital converter circuit comprising a hot side and a cold side separated from the hot side by a first isolator, comprising: converting a first analog input signal to a first side multi-bit digital signal using a first analog-to-digital converter on the hot side; modulating the first side multi-bit digital signal to generate a first single-bit stream using a first modulator in the hot side; transmitting the first single-bit stream from the hot side to the cold side across the first isolator; and filtering the first single-bit stream from the first isolator to generate a first reconstructed multi-bit digital signal using a first filter on the cold side.

In Example 11, the subject matter of Example 10 optionally includes wherein transmitting the first single-bit stream from the hot side to the cold side comprises transmitting the first single-bit stream from a first die to a second die.

In Example 12, the subject matter of any one or more of Examples 10-11 optionally includes converting, using a second analog-to-digital converter, a second analog input signal to a second multi-bit digital signal; modulating the second multi-bit digital signal to generate a second single-bit stream; transmitting the second single-bit stream across a second isolator to a second filter; and filtering, by the second filter, the first single-bit stream from the second isolator to generate a first reconstructed multi-bit digital signal, wherein the first filter and the second filter are on a common die.

In Example 13, the subject matter of any one or more of Examples 10-12 optionally includes decimating the first side multi-bit digital signal before modulating the first side multi-bit digital signal.

In Example 14, the subject matter of any one or more of Examples 10-13 optionally includes receiving a first digital data signal on the hot side; modulating the first digital data signal to a first digital carrier signal at a first carrier frequency to generate a first modulated data signal, wherein the first carrier frequency is greater than a frequency of the first single-bit stream; and adding the first modulated data signal to the first single-bit stream on the hot side.

In Example 15, the subject matter of any one or more of Examples 10-14 optionally includes modulating the first digital data signal to a second digital carrier signal at a second carrier frequency to generate a second modulated data signal, wherein the second carrier frequency is greater than the first carrier frequency, wherein the second carrier frequency is greater than the frequency of the first single-bit stream; and adding the second modulated data signal to the first single-bit stream and the first modulated data signal on the hot side.

In Example 16, the subject matter of Example 15 optionally includes filtering a sum of the first modulated data signal, the second modulated data signal, and the first single-bit stream on the cold side around the first carrier frequency to generate a first filtered signal; generating a first peak signal indicating at least one peak of the first filtered signal; filter the sum of the first modulated data signal, the second modulated data signal, and the first single-bit stream on the cold side around the second carrier frequency to generate a second filtered signal; generating a second peak signal indicating at least one peak of the second filtered signal; and selecting a reconstructed data signal based at least in part on the first peak signal and the second peak signal.

In Example 17, the subject matter of any one or more of Examples 10-16 optionally includes modulating a first bit of a digital data signal and a first digital carrier signal to generate a first modulated data signal, wherein a first carrier frequency of the first digital carrier signal is greater than a frequency of the first single-bit stream; modulating a second bit of the digital data signal and a second digital carrier signal to generate a second modulated data signal, wherein a second carrier frequency of the second digital carrier signal is greater than the first carrier frequency; and adding the first modulated data signal and the second modulated data signal to the first single-bit stream.

Example 18 is an isolated analog-to-digital converter (ADC) circuit, comprising: means, at a first side of the isolated ADC circuit, for converting a first analog input signal to a first side multi-bit digital signal, wherein the first side is separated from a second side of the isolated ADC circuit by a first isolator; means, at the first side, for converting the first side multi-bit digital signal to a first single-bit stream; and means for receiving the first single-bit stream across the first isolator and generating a first reconstructed multi-bit digital signal using the first single-bit stream.

In Example 19, the subject matter of Example 18 optionally includes means, at a third side of the isolated ADC circuit, for converting a second analog input signal to a second multi-bit digital signal, wherein the third side is separated from the second side by a second isolator; means, at the third side, for generating a second single-bit stream using the second multi-bit digital signal; and means, at the second side, for receiving the second single-bit stream across the second isolator and generating a second reconstructed multi-bit signal using the second single-bit stream.

In Example 20, the subject matter of any one or more of Examples 18-19 optionally includes means for generating a first modulated data signal based at least in part on a digital data signal and a digital carrier signal at a first carrier frequency, wherein the first carrier frequency is greater than a frequency of the first single-bit stream; and means for adding the first modulated data signal to the first single-bit stream.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

The term "circuit" can include a dedicated hardware circuit, a general-purpose microprocessor, digital signal processor, or other processor circuit, and may be structurally configured from a general purpose circuit to a specialized circuit such as using firmware or software.

Any one or more of the techniques (e.g., methodologies) discussed herein may be performed on a machine. In various embodiments, the machine may operate as a standalone device or may be connected (e.g., networked) to other machines. In a networked deployment, the machine may operate in the capacity of a server machine, a client machine, or both in server-client network environments. In an example, the machine may act as a peer machine in peer-to-peer (P2P) (or other distributed) network environment. The machine may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuit sets are a collection of circuits implemented in tangible entities that include hardware (e.g., simple circuits, gates, logic, etc.). Circuit set membership may be flexible over time and underlying hardware variability. Circuit sets include members that may, alone or in combination, perform specified operations when operating. In an example, hardware of the circuit set may be immutably designed to carry out a specific operation (e.g., hardwired). In an example, the hardware of the circuit set may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions can enable embedded hardware (e.g., the execution units or a loading mechanism) to create members of the circuit set in hardware via the variable connections to carry out portions of the specific operation when in operation. Accordingly, the computer readable medium is communicatively coupled to the other components of the circuit set member when the device is operating. In an example, any of the physical components may be used in more than one member of more than one circuit set. For example, under operation, execution units may be used in a first circuit of a first circuit set at one point in time and reused by a second circuit in the first circuit set, or by a third circuit in a second circuit set at a different time.

Particular implementations of the systems and methods described herein may involve use of a machine (e.g., computer system) that may include a hardware processor (e.g., a central processing unit (CPU), a graphics processing unit (GPU), a hardware processor core, or any combination thereof), a main memory and a static memory, some or all of which may communicate with each other via an interlink (e.g., bus). The machine may further include a display unit, an alphanumeric input device (e.g., a keyboard), and a user interface (UI) navigation device (e.g., a mouse). In an example, the display unit, input device and UI navigation device may be a touch screen display. The machine may additionally include a storage device (e.g., drive unit), a signal generation device (e.g., a speaker), a network interface device, and one or more sensors, such as a global positioning system (GPS) sensor, compass, accelerometer, or other sensor. The machine may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device may include a machine readable medium on which is stored one or more sets of data structures or instructions (e.g., software) embodying or utilized by any one or more of the techniques or functions described herein. The instructions may also reside, completely or at least partially, within the main memory, within static memory, or within the hardware processor during execution thereof by the machine. In an example, one or any combination of the hardware processor, the main memory, the static memory, or the storage device may constitute machine readable media.

While the machine readable medium can include a single medium, the term "machine readable medium" may include a single medium or multiple media (e.g., a centralized or distributed database, and/or associated caches and servers) configured to store the one or more instructions.

The term "machine readable medium" may include any medium that is capable of storing, encoding, or cat tying instructions for execution by the machine and that cause the machine to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions may further be transmitted or received over a communications network using a transmission medium via the network interface device utilizing any one of a number of transfer protocols (e.g., frame relay, Internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device may include one or more physical jacks (e.g., Ethernet, coaxial, or phone jacks) or one or more antennas to connect to the communications network. In an example, the network interface device may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine, and includes digital or analog communications signals or other intangible medium to facilitate communication of such software.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An isolated analog-to-digital converter (ADC) circuit, comprising:
   a first multi-bit ADC positioned on a first side of the isolated ADC circuit, the first multi-bit ADC configured to convert a first analog input signal to a first side multi-bit digital signal, wherein the first side is separated from a second side of the isolated ADC circuit by a first isolator;
   a digital modulator on the first side, the digital modulator configured to convert the first side multi-bit digital signal to a first single-bit stream; and
   a first filter positioned on the second side, the first filter configured to receive the first single-bit stream across the first isolator and to generate a first reconstructed multi-bit digital signal using the first single-bit stream.

2. The isolated ADC circuit of claim 1, further comprising:
   a first die comprising the first multi-bit ADC and the digital modulator; and
   a second die comprising the first filter, wherein the first isolator provides a signal path between the first die and the second die.

3. The isolated ADC circuit of claim 2, wherein the first die and the second die are part of a first package.

4. The isolated ADC circuit of claim 2, further comprising:
   a third die separated from the second die by a second isolator, the third die comprising:
   a second ADC configured to generate a second multi-bit digital signal using a second analog input signal; and
   a second digital modulator configured to generate a second single-bit stream using the second multi-bit digital signal, and wherein the second die further comprises a second filter configured to receive the second single-bit stream across the second isolator and to generate a second reconstructed multi-bit digital signal using the second single-bit stream.

5. The isolated ADC circuit of claim 1, further comprising a decimator electrically coupled between the first multi-bit ADC and the digital modulator to generate a decimated multi-bit signal.

6. The isolated ADC circuit of claim 5, further comprising a multiplexer electrically coupled to receive the first side multi-bit digital signal, the decimated multi-bit signal, and a multiplexer input, wherein an output of the multiplexer provides the first side multi-bit digital signal when the multiplexer input is provided a first value and provides the decimated multi-bit signal when the multiplexer input is provided a second value.

7. The isolated ADC circuit of claim 1, further comprising:
a first modulator configured to generate a first modulated data signal based at least in part on a digital data signal and a digital carrier signal at a first carrier frequency, wherein the first carrier frequency is greater than a frequency of the first single-bit stream; and
an adder configured to add the first modulated data signal to the first single-bit stream.

8. The isolated ADC circuit of claim 7, further comprising:
a second modulator configured to generate a second modulated data signal based at least in part on the digital data signal and a second digital carrier signal at a second carrier frequency, wherein the second carrier frequency is greater than the first carrier frequency, wherein the second carrier frequency is greater than the frequency of the first single-bit stream, and wherein the adder is also configured to add the second modulated data signal to the first single-bit stream; and
a first band pass filter positioned on the second side, the first band pass filter configured generate a first filtered signal around the first carrier frequency;
a first peak detector configured to generate a first peak signal based at least in part on the first filtered signal;
a second band pass filter positioned on the second side, the second band pass filter configured to generate a second filtered signal around the second carrier frequency;
a second peak detector configured to generate a second peak signal based at least in part on the second filtered signal; and
a data detection circuit configured to select a reconstructed data signal based at least in part on the first peak signal and the second peak signal.

9. The isolated ADC circuit of claim 1, further comprising:
a first modulator configured to generate a first modulated data signal based at least in part on a first bit of a digital data signal and a first digital carrier signal at a first carrier frequency, wherein the first carrier frequency is greater than a frequency of the first single-bit stream;
a second modulator configured to generate a second modulated data signal based at least in part on a second bit of the digital data signal and a second digital carrier signal at a second carrier frequency greater than the first carrier frequency; and
an adder configured to add the first modulated data signal and the second modulated data signal to the first single-bit stream.

10. An analog-to-digital conversion method for an isolated analog-to-digital converter circuit comprising a hot side and a cold side separated from the hot side by a first isolator, comprising:
converting a first analog input signal to a first side multi-bit digital signal using a first multi-bit analog-to-digital converter on the hot side;
modulating the first side multi-bit digital signal to generate a first single-bit stream using a first modulator in the hot side;
transmitting the first single-bit stream from the hot side to the cold side across the first isolator; and
filtering the first single-bit stream from the first isolator to generate a first reconstructed multi-bit digital signal using a first filter on the cold side.

11. The method of claim 10, wherein transmitting the first single-bit stream from the hot side to the cold side comprises transmitting the first single-bit stream from a first die to a second die.

12. The method of claim 10, further comprising:
converting, using a second analog-to-digital converter, a second analog input signal to a second multi-bit digital signal;
modulating the second multi-bit digital signal to generate a second single-bit stream;
transmitting the second single-bit stream across a second isolator to a second filter; and
filtering, by the second filter, the first single-bit stream from the second isolator to generate a first reconstructed multi-bit digital signal, wherein the first filter and the second filter are on a common die.

13. The method of claim 10, further comprising decimating the first side multi-bit digital signal before modulating the first side multi-bit digital signal.

14. The method of claim 10, further comprising:
receiving a first digital data signal on the hot side;
modulating the first digital data signal to a first digital carrier signal at a first carrier frequency to generate a first modulated data signal, wherein the first carrier frequency is greater than a frequency of the first single-bit stream; and
adding the first modulated data signal to the first single-bit stream on the hot side.

15. The method of claim 14, further comprising:
modulating the first digital data signal to a second digital carrier signal at a second carrier frequency to generate a second modulated data signal, wherein the second carrier frequency is greater than the first carrier frequency, wherein the second carrier frequency is greater than the frequency of the first single-bit stream; and
adding the second modulated data signal to the first single-bit stream and the first modulated data signal on the hot side.

16. The method of claim 15, further comprising:
filtering a sum of the first modulated data signal, the second modulated data signal, and the first single-bit stream on the cold side around the first carrier frequency to generate a first filtered signal;
generating a first peak signal indicating at least one peak of the first filtered signal;
filter the sum of the first modulated data signal, the second modulated data signal, and the first single-bit stream on the cold side around the second carrier frequency to generate a second filtered signal;
generating a second peak signal indicating at least one peak of the second filtered signal; and selecting a reconstructed data signal based at least in part on the first peak signal and the second peak signal.

17. The method of claim 10, further comprising:

modulating a first bit of a digital data signal and a first digital carrier signal to generate a first modulated data signal, wherein a first carrier frequency of the first digital carrier signal is greater than a frequency of the first single-bit stream;

modulating a second bit of the digital data signal and a second digital carrier signal to generate a second modulated data signal, wherein a second carrier frequency of the second digital carrier signal is greater than the first carrier frequency; and adding the first modulated data signal and the second modulated data signal to the first single-bit stream.

18. An isolated analog-to-digital converter (ADC) circuit, comprising:

a multi-bit ADC at a first side of the isolated ADC circuit, the multi-bit ADC for converting a first analog input signal to a first side multi-bit digital signal, wherein the first side is separated from a second side of the isolated ADC circuit by a first isolator;

means, at the first side, for converting the first side multi-bit digital signal to a first single-bit stream; and means for receiving the first single-bit stream across the first isolator and generating a first reconstructed multi-bit digital signal using the first single-bit stream.

19. The isolated ADC circuit of claim 18, further comprising:

means, at a third side of the isolated ADC circuit, for converting a second analog input signal to a second multi-bit digital signal, wherein the third side is separated from the second side by a second isolator;

means, at the third side, for generating a second single-bit stream using the second multi-bit digital signal, and means, at the second side, for receiving the second single-bit stream across the second isolator and generating a second reconstructed multi-bit signal using the second single-bit stream.

20. The isolated ADC circuit of claim 18, further comprising:

means for generating a first modulated data signal based at least in part on a digital data signal and a digital carrier signal at a first carrier frequency, wherein the first carrier frequency is greater than a frequency of the first single-bit stream; and means for adding the first modulated data signal to the first single-bit stream.

* * * * *